US012813287B2

(12) United States Patent
Liu

(10) Patent No.: US 12,813,287 B2
(45) Date of Patent: Nov. 24, 2026

(54) SEMICONDUCTOR PACKAGE AND METHOD OF FORMING THE SAME

(71) Applicant: Taiwan Semiconductor Manufacturing Company, Ltd., Hsinchu (TW)

(72) Inventor: Zi-Jheng Liu, Taoyuan City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 462 days.

(21) Appl. No.: 18/500,133

(22) Filed: Nov. 2, 2023

(65) Prior Publication Data

US 2025/0149491 A1 May 8, 2025

(51) Int. Cl.

| | |
|---|---|
| ***H10W 70/09*** | (2026.01) |
| ***H10W 70/654*** | (2026.01) |
| *H10W 70/60* | (2026.01) |
| *H10W 70/652* | (2026.01) |
| *H10W 72/00* | (2026.01) |
| *H10W 74/15* | (2026.01) |
| *H10W 90/00* | (2026.01) |

(52) U.S. Cl.

CPC ......... *H10W 70/09* (2026.01); *H10W 70/654* (2026.01); *H10W 70/60* (2026.01); *H10W 70/6528* (2026.01); *H10W 72/0198* (2026.01); *H10W 74/15* (2026.01); *H10W 90/724* (2026.01); *H10W 90/734* (2026.01)

(58) Field of Classification Search

CPC ... H10W 70/09; H10W 70/654; H10W 99/00; H10W 70/05

See application file for complete search history.

(56) References Cited

U.S. PATENT DOCUMENTS

| | | | | |
|---|---|---|---|---|
| 2015/0364404 A1* | 12/2015 | Chen | H10W 90/701 | 257/759 |
| 2016/0133571 A1* | 5/2016 | Lee | H10W 70/09 | 257/774 |
| 2016/0276277 A1* | 9/2016 | Syu | H10W 70/65 | |
| 2019/0304912 A1* | 10/2019 | Ecton | H10W 70/05 | |
| 2021/0375708 A1* | 12/2021 | Kuo | H10W 70/09 | |
| 2022/0108957 A1* | 4/2022 | May | H10W 70/09 | |

* cited by examiner

*Primary Examiner* — Peter M Albrecht
(74) *Attorney, Agent, or Firm* — JCIPRNET

(57) ABSTRACT

A semiconductor package and a method of forming the same are provided. The semiconductor package includes a first die, a second die and a redistribution layer structure. The first die and the second die are disposed laterally. The redistribution layer structure is disposed over and electrically connected to the first die and the second die. The redistribution layer structure includes a plurality of vias and a plurality of lines stacked alternately and electrically connected to each other and embedded by a plurality of polymer layers. The redistribution layer structure further includes a first pad overlapped with the first die and a second pad overlapped with the second die. The first pad, the second pad and lines closest to the first die and the second die are located at substantially the same level, and from a top view, the first pad and the second pad have different shapes.

20 Claims, 19 Drawing Sheets

SEMICONDUCTOR PACKAGE AND METHOD OF FORMING THE SAME

BACKGROUND

The semiconductor industry has experienced rapid growth due to continuous improvements in the integration density of various electronic components (e.g., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Although the existing semiconductor packages have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3C' is another simplified enlarged top view illustrating a portion of the structure of FIG. 1D according to some embodiments of the present disclosure.

DETAILED DESCRIPTION

Figure 1A:
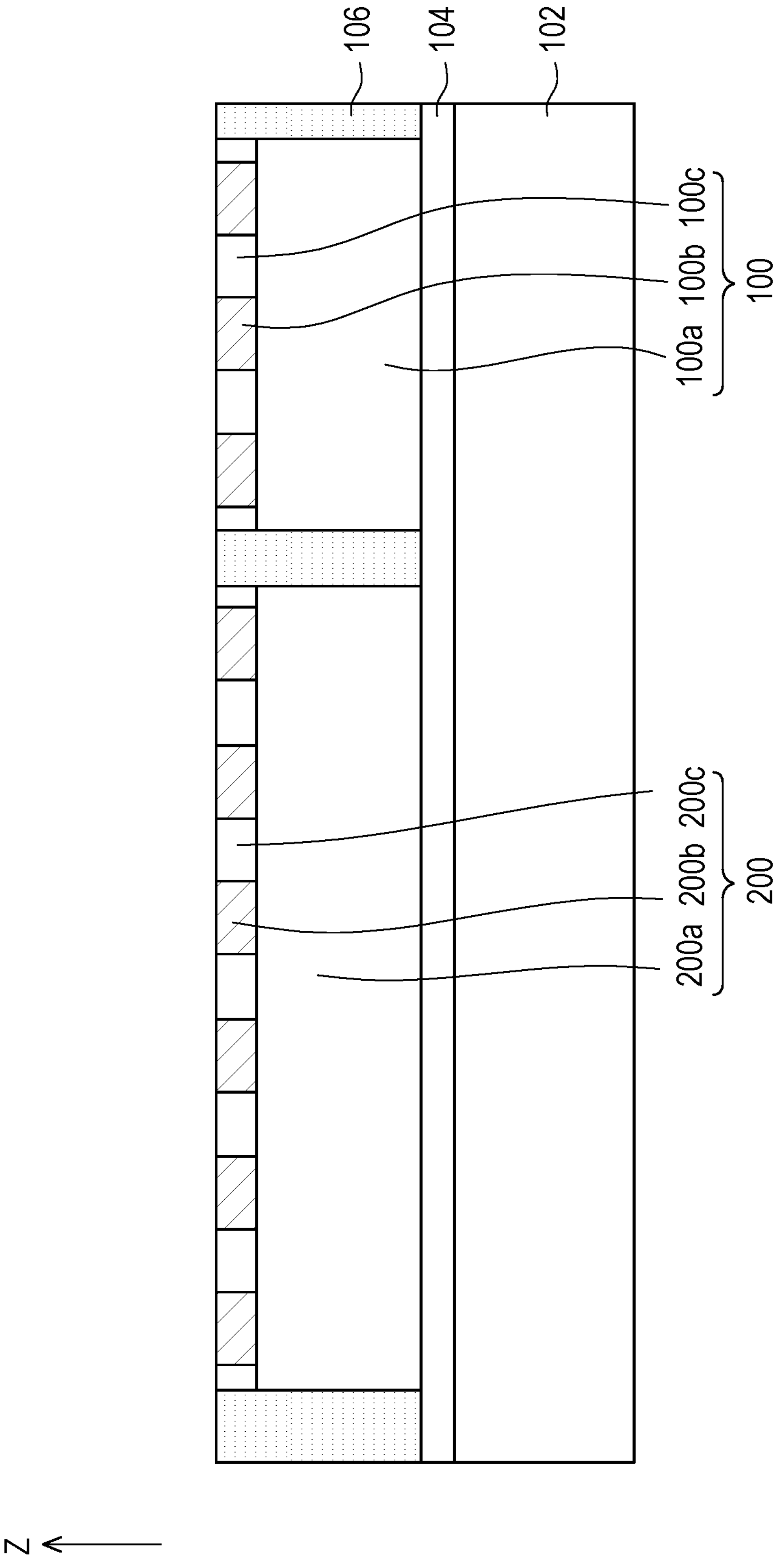
FIG. 1A to FIG. 1D are schematic cross-sectional views illustrating a method of forming a semiconductor package according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In multi-chip package applications, high-bandwidth die-to-die (D2D) interconnections are highly desired, and the D2D I/O densities continue to increase. In the manufacture of semiconductor packages, chip-first schemes show better cost benefit than chip-last schemes. However, the die shift occurs in the chip-first schemes (e.g., occurred in pick and place process, molding and/or grinding processes, etc.)

makes it difficult to increase D2D I/O density for chip-first process due to pitch/overlay limitation.

In the present disclosure, a redistribution layer structure is included in a semiconductor package for routing and interconnecting dies and/or semiconductor devices. Elongated pads in the first metal feature layer of the redistribution layer structure are provided to correct the die shift and/or to break through the pitch limitation for chip-first process. In some embodiments, with the arrangement of the elongated pads of the disclosure, the pitch limitation can be reduced from 20 μm to 12 μm. In some embodiments, the first polymer layer of the redistribution layer structure adopts a by-die exposure process (exposures are performed according to regions where different dies are located, each exposure is for a single die) to respectively form via openings over different dies; therefore, enabling to enlarge critical dimensions of vias landing on the die connectors of the dies for reliability improvement (reduce crack). In some embodiments, the die shift correction is completed by the first metal feature layer (including the vias in the first polymer layer and the pads on the first polymer layer), and the layers above the first metal feature layer can return to global alignment and/or global exposure; therefore, enabling to reduce alignment complexity for stacking of metal features and polymer layers and/or decrease the seam risk for negative-tone polymer layers (e.g., low-temperature curable negative-tone photosensitive polyimide). And thus, providing better overlay management, ensuring manufacturing time/cost and/or ensuring price competitiveness.

FIG. 1A to FIG. 1D are schematic cross-sectional views illustrating a method of forming a semiconductor package according to some embodiments of the present disclosure. It is understood that the disclosure is not limited by the method described below. Additional operations can be provided before, during, and/or after the method and some of the operations described below can be replaced or eliminated, for additional embodiments of the methods.

Referring to FIG. 1A, at least two dies (e.g., a first die 100 and a second die 200) are provided on a carrier 102. In some embodiments, the carrier 102 is provided with a debond layer 104 coated thereon, and the material of the debond layer may be any material suitable for debonding the carrier 102 from the above dies disposed thereon. In some embodiments, the carrier 102 is made of a non-semiconductor material, such as a glass carrier, a ceramic carrier, or the like. In some embodiments, the debond layer 104 includes an Ultra-Violet (UV) glue, a Light-to-Heat Conversion (LTHC) glue, or the like, although other types of adhesives may be used. The debond layer 104 is decomposable under the heat of light to thereby release the carrier 102 from the structure formed thereon.

In some embodiments, although not shown, through dielectric vias (TIVs) are formed on the carrier 102. In some embodiments, the TIVs are through integrated fan-out (InFO) vias. In some embodiments, the material of the TIVs include copper, nickel, titanium, the like, or a combination thereof, and are formed by photolithography, plating, and photoresist stripping processes.

In some embodiments, the first die 100 and the second die 200 are provided on the carrier 102 through pick and place processes. In some embodiments, although not shown, a die attach film is provided between the debond layer 104 and the first die 100 and a die attach film is provided between the debond layer 104 and the second die 200 for better adhering the first die 100 and the second die 200 to the debond layer 104.

In some embodiments, the first die 100 and the second die 200 may include different types of dies or the same types of dies. In some embodiments, the first die 100 and the second die 200 may include one or more types of chips selected from application-specific integrated circuit (ASIC) chips, analog chips, sensor chips, wireless and radio frequency chips, voltage regulator chips or memory chips. The dies and chips may be used interchangeably through the specification.

In some embodiments, the first die 100 includes a substrate 100*a*, pads (not shown), a passivation layer (not shown), die connectors 100*b* and an optional protection layer 100*c*. The substrate 100*a* includes, for example but not limited to, bulk silicon, doped or undoped, or an active layer of a semiconductor-on-insulator (SOI) substrate. The substrate 100*a* has a device layer including at least one transistor and an interconnection layer. The pads are formed over the substrate 100*a*, and the passivation layer is formed over the pads 100*b*. In some embodiments, the pads are aluminum pads, and the passivation layer includes a polymer material such as polybenzoxazole (PBO), polyimide, benzocyclobutene (BCB), the like, or a combination thereof. The die connectors 100*b* are formed through the passivation layer and electrically connected to underlying pads or an interconnection structure. In some embodiments, the die connectors 100*b* are formed as the top portions of the first die 100. The die connectors 100*b* protrude from the remaining portions or lower portions of the first die 100. Throughout the description, the side of the first die 100 with the die connectors 100*b* are referred to as a front side or an active side. The die connectors 100*b* may include Cu. W. Ni, Sn, Ti, Au, an alloy or a combination thereof, and are formed with an electroplating process. The die connectors 100*b* may have a circle-like shape from a top view. In some embodiments, the protection layer 100*c* includes polybenzoxazole (PBO), polyimide (PI), a suitable organic or inorganic material or the like. In some embodiments, the protection layer 100*c* may be optional and omitted from the first die 100.

In some embodiments, the second die 200 includes a substrate 200*a*, pads (not shown), a passivation layer (not shown), die connectors 200*b* and an optional protection layer 200*c*. The materials and arrangements of these elements of the second die 200 are similar to those of the first die 100, so the details are not iterated herein. In some embodiments, the first die 100 and the second die 200 are designed to have the same size (top area and/or height) and function. In other embodiments, the first die 100 and the second die 200 are designed to have different sizes (top areas and/or heights) and functions as needed.

In some embodiments, the TIVs are formed on the carrier 102 before the dies (including the first die 100 and the second die 200) are picked and placed on the carrier 102. In other embodiments, the TIVs are formed on the carrier 102 after the dies are picked and placed on the carrier 102.

In one embodiment, the first die 100 and the second die 200 are provided and bonded to the carrier 102 with the active surface facing upward (as seen in FIG. 1A). In certain embodiment, the TIVs are arranged along the periphery of the dies. However, depending on product design, some of the TIVs may be arranged at locations other than the periphery of the dies. In some embodiments, although not shown, in addition to the dies placed over the carrier 102 side-by-side as shown in FIG. 1A, another die is further included and placed vertically or laterally aside the dies. The number of the dies arranged side-by-side or vertically stacked over another die(s) may be adjusted or modified based on the product design but are not limited by the present disclosure.

Still referring to FIG. 1A, in some embodiments, the dies and the TIVs located over the carrier 102 are molded and encapsulated in a dielectric encapsulation layer 106. In one embodiment, the dielectric encapsulation layer 106 is formed around the dies and the TIVs. In one embodiment, the dielectric encapsulation layer 106 includes a molding compound such as epoxy, a photo-sensitive material such as polybenzoxazole (PBO), polyimide (PI) or benzocyclobutene (BCB), a combination thereof or the like. The method of forming the dielectric encapsulation layer 106 includes forming an encapsulant material layer (not shown) on the carrier 102 covering the dies and the TIVs, and performing a grinding process to partially remove the encapsulant material layer until the top surfaces of the TIVs and the die connectors 100*b* and 200*b* are exposed. In some embodiments, when the protection layers 100*c* and 200*c* are omitted, the dielectric encapsulation layer 106 is in contact with the die connectors 100*b* and 200*b*.

Figure 1B:
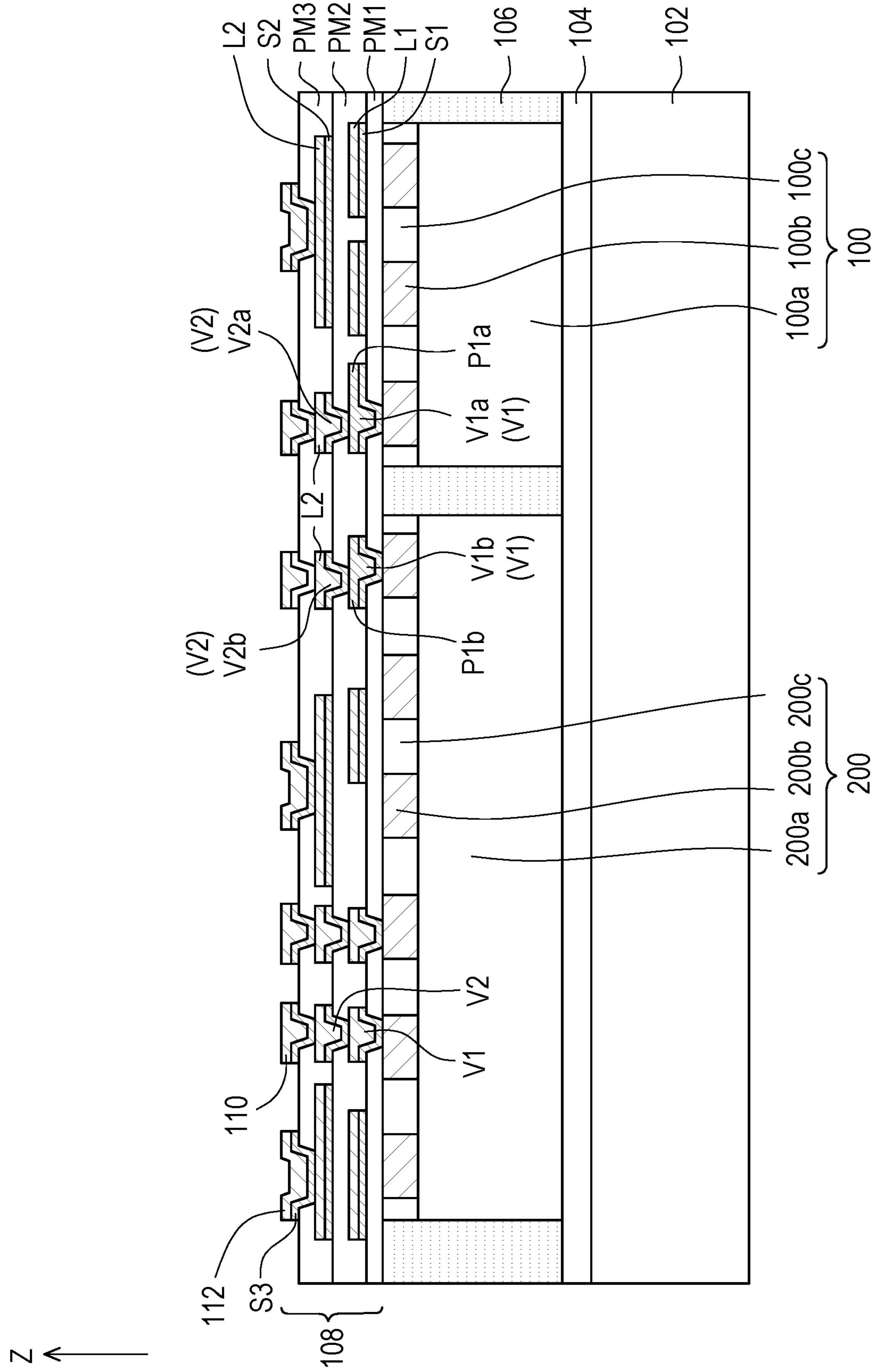

Referring to FIG. 1B, a redistribution layer structure 108 is formed on the dielectric encapsulation layer 106, over the TIVs and on the dies (including the first die 100 and the second die 200). In some embodiment, the redistribution layer structure 108 is electrically connected to the TIVs and the dies. The formation of the redistribution layer structure 108 includes sequentially forming more than one polymer material layers and more than one metallization layers in alternation.

The redistribution layer structure 108 may include metal features embedded by polymer layers. The metal features are disposed in the polymer layers and electrically connected with each other. The polymer layers may include a photo-sensitive material such as polybenzoxazole (PBO), polyimide (PI), benzocyclobutene (BCB), the like, or a combination thereof. The polymer layers of the redistribution layer structure 108 may be replaced by dielectric layers or insulating layers as needed. The metal features include metal lines, metal vias and/or metal pads. The metal vias are formed between and in contact with two metal lines, one metal line and one die connector (e.g., one die connector 100*b* or 200*b*), or one metal pad and one die connector (e.g., one die connector 100*b* or 200*b*). The metal features may include Cu, Al, Ti. Ta, W, Ru, Co, Ni, the like, or a combination thereof. In some embodiments, a metal liner layer may be disposed between each metal feature and the polymer layer. In some embodiments, the metal liner layer includes a seed layer and/or a barrier layer. The seed layer may include Ti/Cu. The barrier layer may include Ta, TaN, Ti, TiN, CoW or a combination thereof. In some embodiments, the redistribution layer structure 108 is formed by a dual damascene process. For example, a metal line and the underlying metal via may be formed as an integrated line and via structure without an interface by a dual damascene process.

For example, metal features (a first pad P1*a*, a second pad P1*b*, lines L1 and vias V1) are formed by lining via openings of a first polymer layer PM1 with a seed layer, forming a photoresist layer with line openings and pad openings on the seed layer, plating the metal features (the first pad P1*a*, the second pad P1*b*, the lines L1 and the vias V1) from the seed layer, and removing the photoresist layer and the underlying seed layer. Seed layers S1 are provided between the metal features (the first pad P1*a*, the second pad P1*b*, the lines L1 and the vias V1) and the first polymer layer PM1. The pads (including the first pad P1*a* and the second pad P1*b*) and the lines L1 are located at substantially the same level and made of the same material, but for case of identification, the pads and the lines L1 are marked differently. In some embodiments, the via openings of the first polymer layer PM1 are controlled properly (e.g., less than about 10 μm or 5 μm), so the formed vias V1 may have planar top surfaces for the landing of the overlying vias V2. A second polymer layer PM2 is then formed on the first polymer layer PM1.

Thereafter, metal features (lines L2 and vias V2) are formed by lining via openings of the second polymer layer PM2 with a seed layer, forming a photoresist layer with line openings on the seed layer, plating the metal features (the lines L2 and the vias V2) from the seed layer, and removing the photoresist layer and the underlying the seed layer. Seed layers S2 are provided between the metal features (the lines L2 and the vias V2) and the second polymer layer PM2. In some embodiments, the via openings of the second polymer layer PM2 are controlled properly (e.g., less than about 10 μm or 5 μm), so the formed vias V2 may have planar top surfaces for the landing of the overlying vias (if needed). A third polymer layer PM3 is then formed on the second polymer layer PM2.

In some embodiments, the vias V2 are vertically aligned to (directly over) the underlying vias V1. Such stacked vias provide two advantageous features. Firstly, vias are vertically stacked, and the chip area is saved. Metal lines or routing lines may be placed closer to each other. Secondly, by stacked vias, the signal paths can be shortened, and hence the side effects such as the parasitic capacitance caused by lengthened signal paths can be reduced. This is especially beneficial for high-frequency signals.

Still referring to FIG. 1B, connection pads 110 and under-ball metallurgy (UBM) pads 112 are formed through the third polymer layer PM3 and electrically connected to the underlying metal feature (the vias V2 and the lines L2) of the redistribution layer structure 108. In some embodiments, the connection pads 110 and the UBM pads 112 are regarded as part of the redistribution layer structure 108. In some embodiments, the UBM pads 112 surround the connection pads 110, and the dimension of the UBM pads 112 is greater than the dimension of the connection pads 110. In some embodiments, the connection pads 110 and the UBM pads 112 include copper, nickel, titanium, a combination thereof or the like, and are formed by an electroplating process. In some embodiments, seed layers S3 are provided between the connection pads 110 and the third polymer layer PM3 and between the UBM pads 112 and the third polymer layer PM3.

Figure 1C:
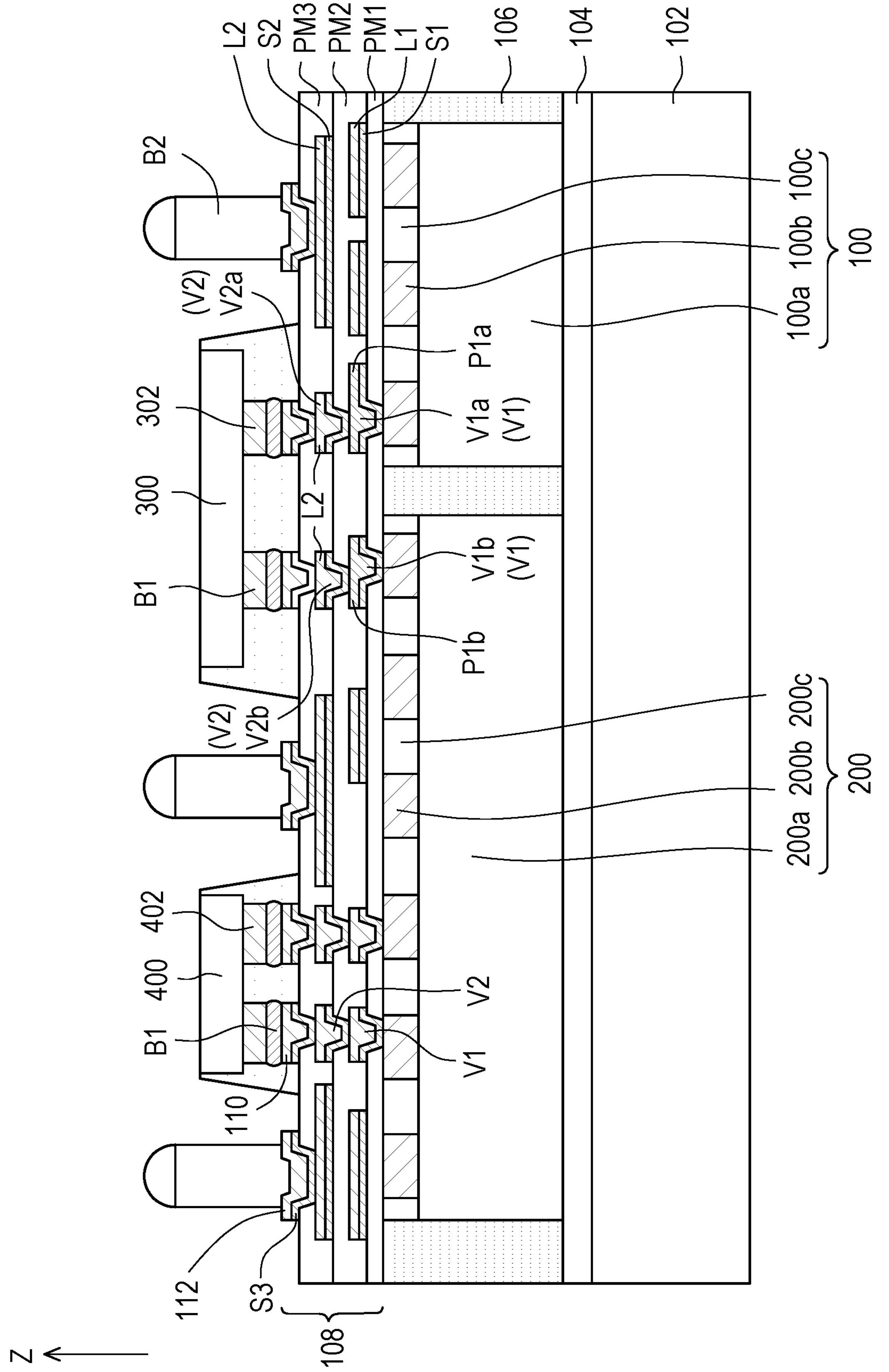

Referring to FIG. 1C, at least one die or device (e.g., a bridge die 300 and a device 400) with connection pads (e.g., connection pads 302 and connection pads 402) is bonded to the connection pads 110 through micro-bumps B1, and conductive elements or bumps B2 are placed on and electrically connected to the UBM pads 112. In some embodiments, the bridge die 300 is bonded to the connection pads 110 with the front side thereof facing the front-side of the redistribution layer structure 108. In some embodiments, the bridge die 300 is a large scale integration (LSI) die for electrical connection between the first die 100 and the second die 200. Specifically, the bridge die 300 is disposed over the first die 100 and the second die 200 and electrically connects the first die 100 with the second die 200 through the first pad P1*a* and the second pad P1*b*. In some embodiments, as shown in FIG. 1C, the bridge die 300 electrically connects the first die 100 with the second die 200 through the seed layers S1, the first via V1*a*, the second via V1*b*, the first pad P1*a*, the second pad P1*b*, the seed layers S2, the third via V2*a*, the fourth via V2*b*, the lines L2, the seed layers S3, the connection pads 110 and the micro-bumps B1.

In some embodiments, the device 400 is bonded to the connection pads 110 with the front side thereof facing the front-side of the redistribution layer structure 108. In some embodiments, the device 400 is an integrated passive device (IPD) including resistors, capacitors, inductors, resonators, filters, and/or the like. In other embodiments, the device 400 can be an integrated active device (IAD) upon the process requirements. In some embodiments, the micro-bumps B1 and bumps B2 may be solder bumps, and/or may include metal pillars (e.g., copper pillars), solder caps formed on metal pillars, and/or the like. When solder is used, the solder may include either eutectic solder or non-eutectic solder. The solder may include lead or be lead-free, and may include Sn—Ag, Sn—Cu, Sn—Ag—Cu, or the like. The micro-bumps B1 and bumps B2 may be formed respectively by a suitable process such as evaporation, electroplating, ball drop, or screen printing.

Figure 1D:
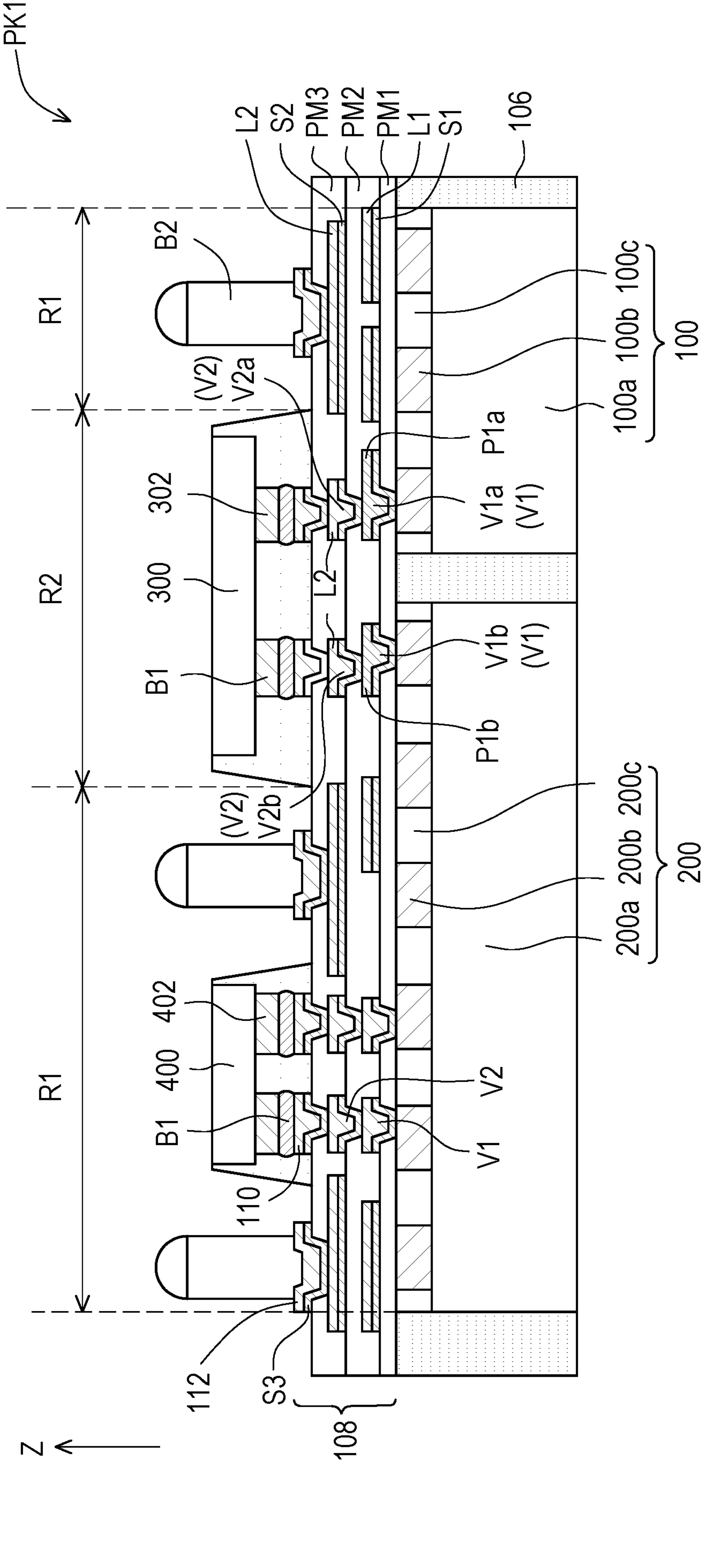

Referring to FIG. 1D, the carrier 102 is removed. The carrier 102 is de-bonded from the backside of the structure of FIG. 1C. In some embodiments, the de-bonding layer 104 is decomposed under heat of light, and the carrier 102 is then released from the structure formed thereon. A semiconductor package PK1 of some embodiments is thus completed.

According to some embodiments, the semiconductor package PK1 includes a first die 100, a second die 200 and a redistribution layer structure 108. The first die 100 and the second die 200 are disposed laterally. The redistribution layer structure 108 is disposed over and electrically connected to the first die 100 and the second die 200, wherein the redistribution layer structure 108 includes a plurality of vias (e.g., vias V1 and vias V2) and a plurality of lines (e.g., lines L1 and lines L2) stacked alternately and electrically connected to each other and embedded by a plurality of polymer layers (including the first polymer layer PM1, the second polymer layer PM2 and the third polymer layer PM3). The redistribution layer structure 108 further includes a first pad Pla overlapped with and electrically connected to the first die 100 and a second pad P1*b* overlapped with and electrically connected to the second die 200. The first pad Pla, the second pad P1*b* and lines L1 among the plurality of lines that are closest to the first die 100 and the second die 200 are located at substantially the same level, and from a top view, the first pad Pla and the second pad Plb have different shapes (as shown in FIG. 2B).

Figure 2A:
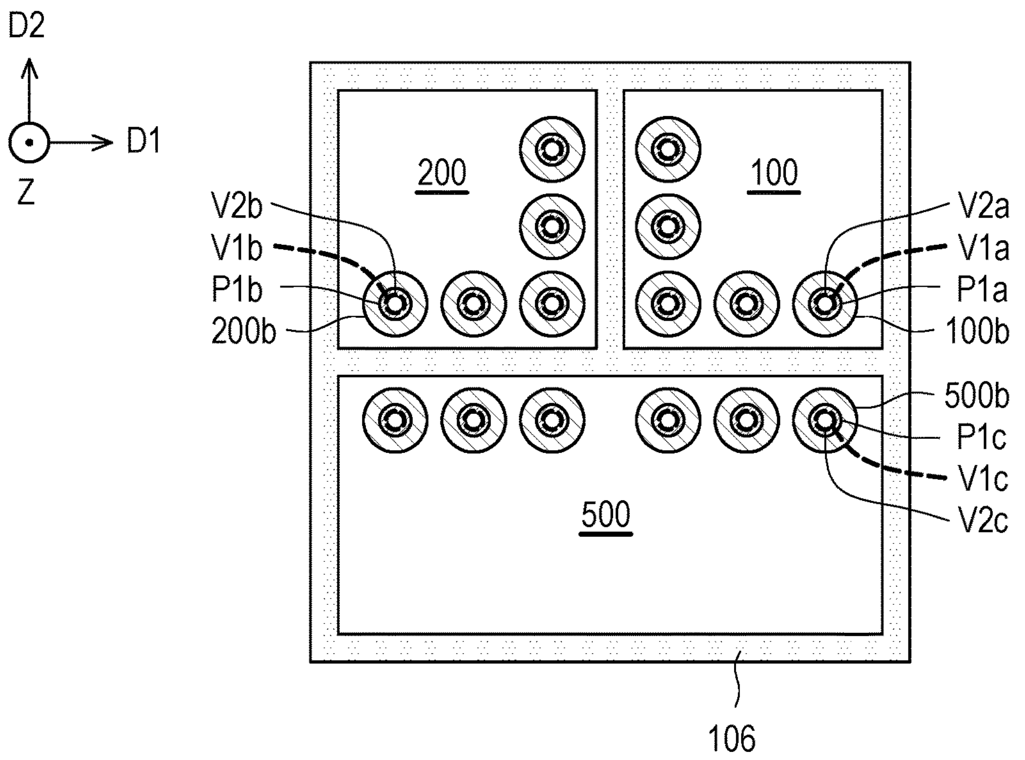
FIG. 2A and FIG. 2B are simplified enlarged top views illustrating semiconductor packages with and without die shift in the case of stacked vias.
Figure 2B:
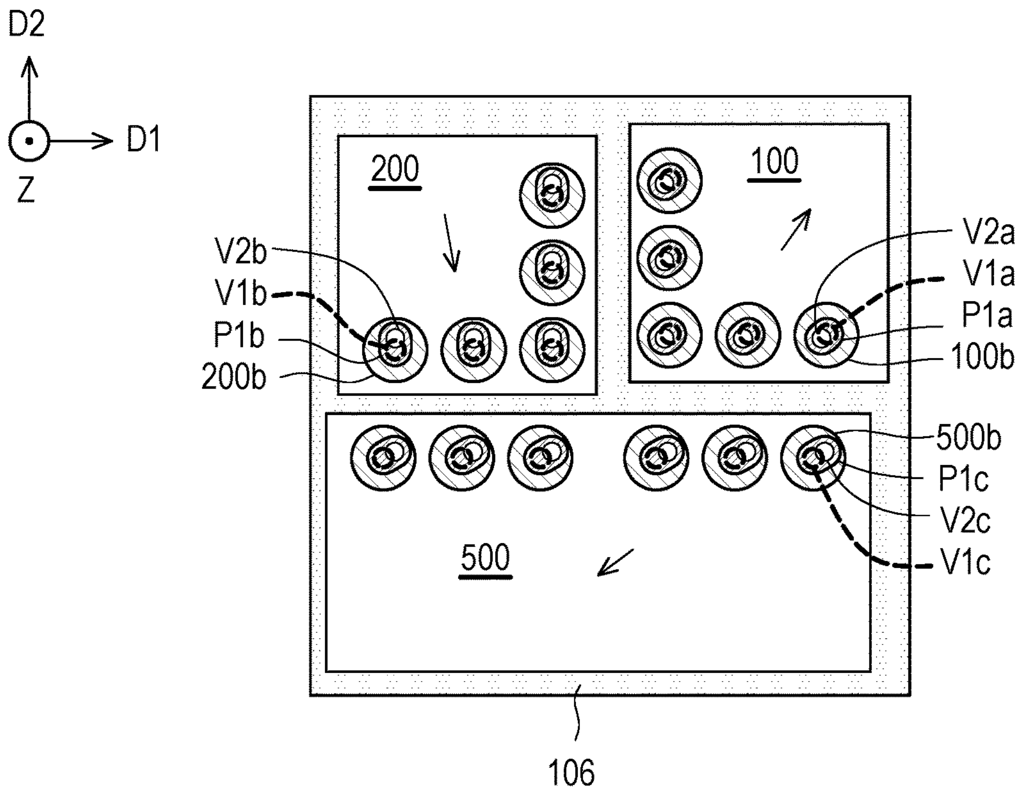

Take FIG. 2A and FIG. 2B as example. FIG. 2A and FIG. 2B are simplified enlarged top views illustrating semiconductor packages with and without die shift in the case of stacked vias. In FIG. 2A and FIG. 2B, each semiconductor package includes a first die 100, a second die 200 and a third die 500 that are packaged by the dielectric encapsulation layer 106. However, the number of the dies may be adjusted or modified based on the product design and are not limited by the present disclosure. For illustration purposes, die connectors 100*b*, 200*b*, 500*b* of the dies, vias (e.g., V1*a*, V1*b* and V1*c*) located in the first polymer layer (e.g., the first polymer layer PM1 shown in FIG. 1D), pads (e.g., P1*a*, P1*b*, Plc) disposed on the first polymer layer and vias (e.g., V2*a*, V2*b* and V2*c*) located in the second polymer layer (e.g., the second polymer layer PM2 shown in FIG. 1D) are shown in FIG. 2A and FIG. 2B, while other elements of the semiconductor packages are omitted.

For an ideal stacked vias case of chip-first schemes, as shown in FIG. 2A, no die shift occurs to the dies in the semiconductor package, and die connectors 100*b*, 200*b*, 500*b* of the dies are aligned along direction D1 and direction D2. The vias (e.g., V1*a*, V1*b* and V1*c*) located in the first polymer layer are designed to be vertically aligned (aligned along direction Z) to the underlying die connectors 100*b*, 200*b*, 500*b*. The pads (e.g., P1*a*, P1*b*, Plc) disposed on the first polymer layer are designed to be vertically aligned to the underlying vias (e.g., V1*a*, V1*b* and V1*c*). The vias (e.g., V2*a*. V2*b* and V2*c*) located in the second polymer layer are designed to be vertically aligned to the underlying pads (e.g., P1*a*, P1*b*, Plc).

However, in a practical stacked vias case of chip-first schemes, as shown in FIG. 2B, die shift occurs to the dies in the semiconductor package during, for example but not limited to, pick and place processes, molding and/or grinding processes. Arrows in FIG. 2B denote the die shift direction of the dies (including the first die 100, the second die 200 and the third die 500). Due to the die shift, die connectors of different dies are not aligned along direction D1 and direction D2. For example, as shown in FIG. 2B, die connectors 100*b* and die connectors 200*b* are not aligned along direction D1, die connectors 100*b* and die connectors 500*b* are not aligned along direction D2, and die connectors 200*b* and die connectors 500*b* are not aligned along direction D2.

In some embodiments, based on the considerations of manufacturing time or cost, reliability of the vias (e.g., V1*a*. V1*b* and V1*c*), alignment complexity, overlay limitation, pitch limitation, price competitiveness, size miniaturization or the like, the first metal feature layer (including P1*a*, P1*b*, Plc, V1*a*, V1*b* and V1*c*) of the redistribution layer structure are used for die shift correction, so that layers above the first metal feature layer can return to global alignment (a single exposure is performed for all dies on the carrier).

Specifically, the vias (e.g., V1*a*, V1*b* and V1*c*) may be formed to land on the die connectors 100*b*, 200*b*, 500*b*. In some embodiments, the vias (e.g., V1*a*, V1*b* and V1*c*) are vertically aligned to (directly over) the die connectors 100*b*, 200*b*, 500*b*, but not limited thereto. The pads (e.g., P1*a*, P1*b*, Plc) may be formed of elongated pads, so that the overlying vias (e.g., V2*a*, V2*b* and V2*c*) that are bridged to the vias (e.g., V1*a*, V1*b* and V1*c*) by the pads (e.g., P1*a*, P1*b*, Plc) can be aligned along direction D1 and direction D2.

The shape of each pad is related to the die shift of the corresponding/overlapped die. The greater the die shift, the greater the die shift correction. The greater the die shift correction, the longer the pad, so the shape of the pad may be change from circular (see FIG. 2A) or circle-like to elliptical or elliptical-like. In some embodiments, as shown in FIG. 2B, from the top view, the pads overlapped with the same die may have the same shape, and the pads overlapped with different dies have different shapes. For example, the first pads P1*a* overlapped with the first die 100 have the same shape (e.g., circle-like shape); the second pads P1*b* overlapped with the second die 200 have the same shape (e.g., elliptical-like shape); and the third pads Plc overlapped with the third die 500 have the same shape (e.g., elliptical-like shape shorter than the second pads). The first pads P1, the second pads P1*b* and the third pads Plc have different shapes. In some embodiments, the first pads P1, the second pads P1*b* and the third pads Plc extend along different directions. In some embodiments, the first pads P1, the second pads P1*b* and the third pads Plc have different lengths.

In the stacked vias case, as shown in FIG. 2B, the stacked vias corresponding to the same die connector may be partially overlapped instead of vertically aligned (i.e., not aligned along direction Z). As shown in FIG. 2B, the vias include a first via V1*a*, a second via V1*b*, a third via V2*a*, a fourth via V2*b*, a fifth via V1*c* and a sixth via V2*c*. The first via V1*a* and the third via V2*a* are stacked vias respectively located on opposite surfaces (e.g., top and bottom surfaces) of the first pad P1. The second via V1*b* and the fourth via V2*b* are stacked vias respectively located on opposite surfaces (e.g., top and bottom surfaces) of the second pad P1*b*. The fifth via V1*c* and the sixth via V2*c* are stacked vias respectively located on opposite surfaces (e.g., top and bottom surfaces) of the third pad Plc. From the top view, a center of the third via V2*a* is offset from a center of the first via V1*a*, a center of the fourth via V2*b* is offset from a center of the second via V1*b*, and a center of the sixth via V2*c* is offset from a center of the fifth via V1*c*.

Figure 3A:
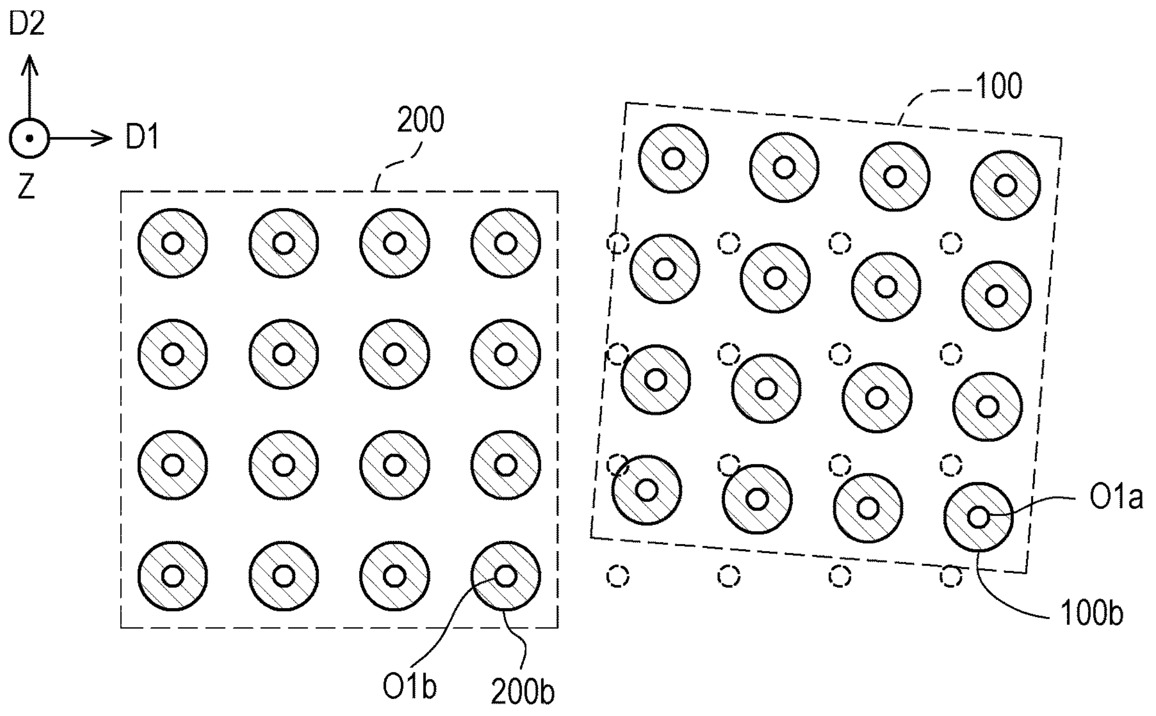
FIG. 3A to FIG. 3C are simplified enlarged top views illustrating a method of forming a portion of the structure of FIG. 1D according to some embodiments of the present disclosure.
Figure 3B:
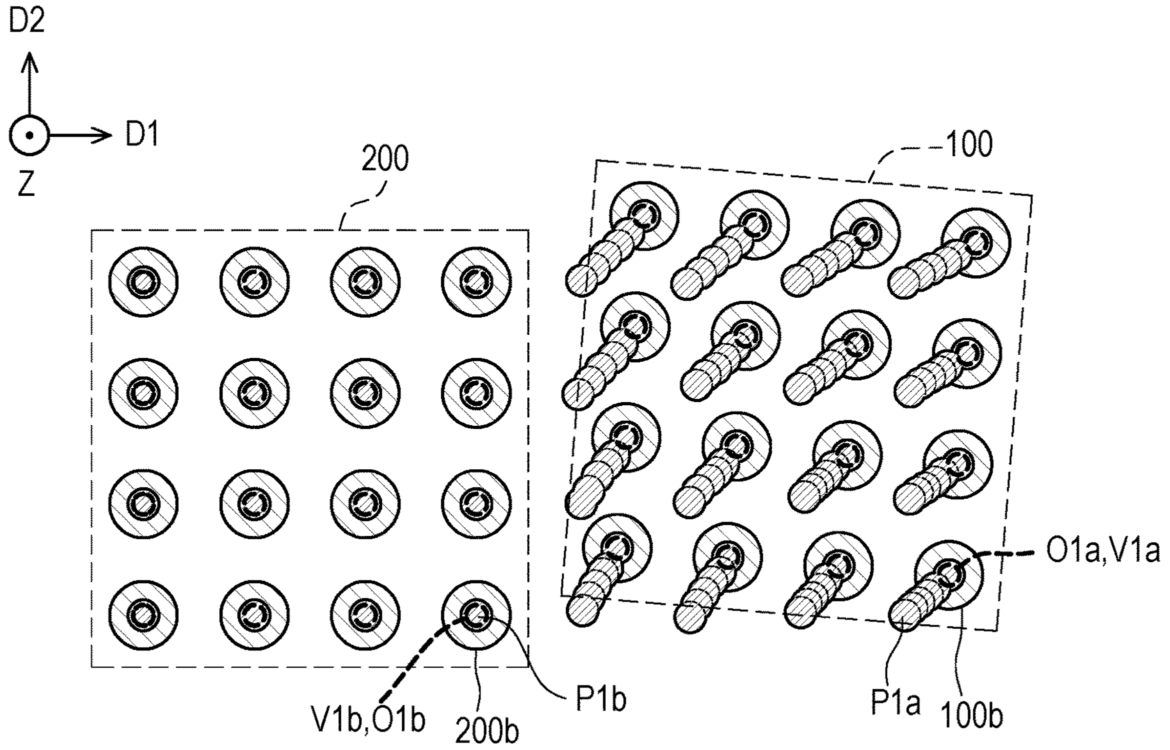
Figure 3C:
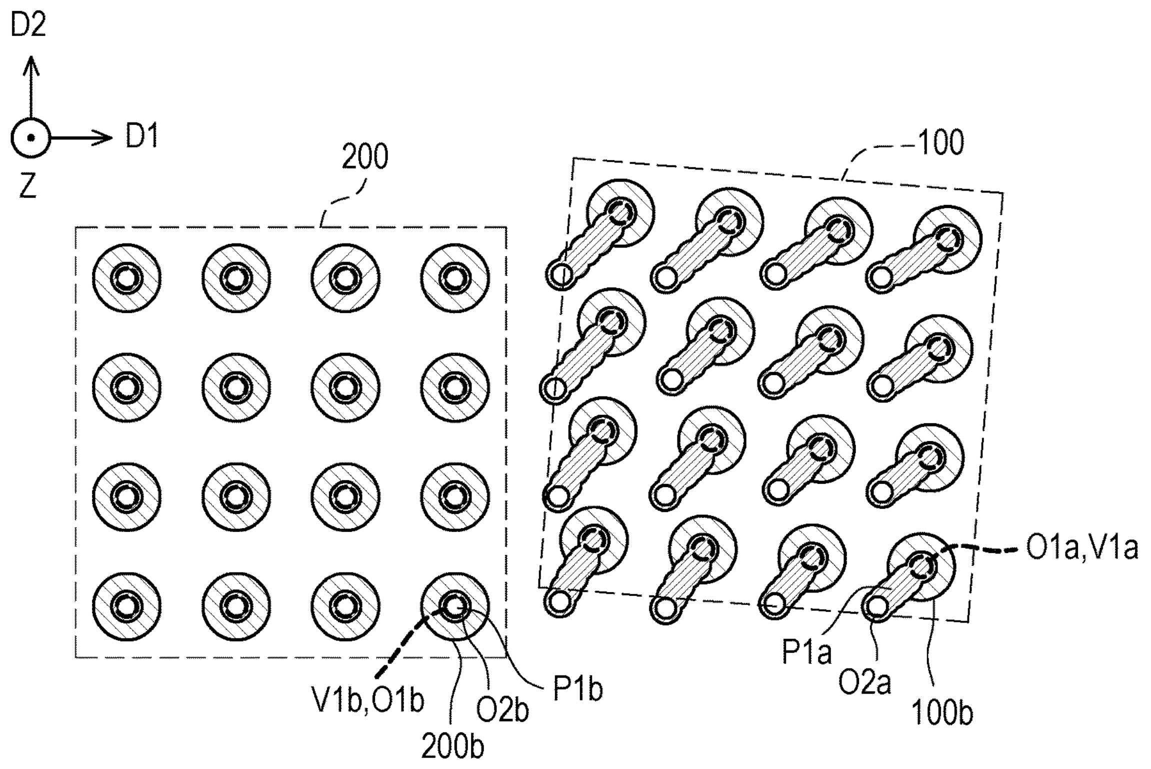
Figure 3C:
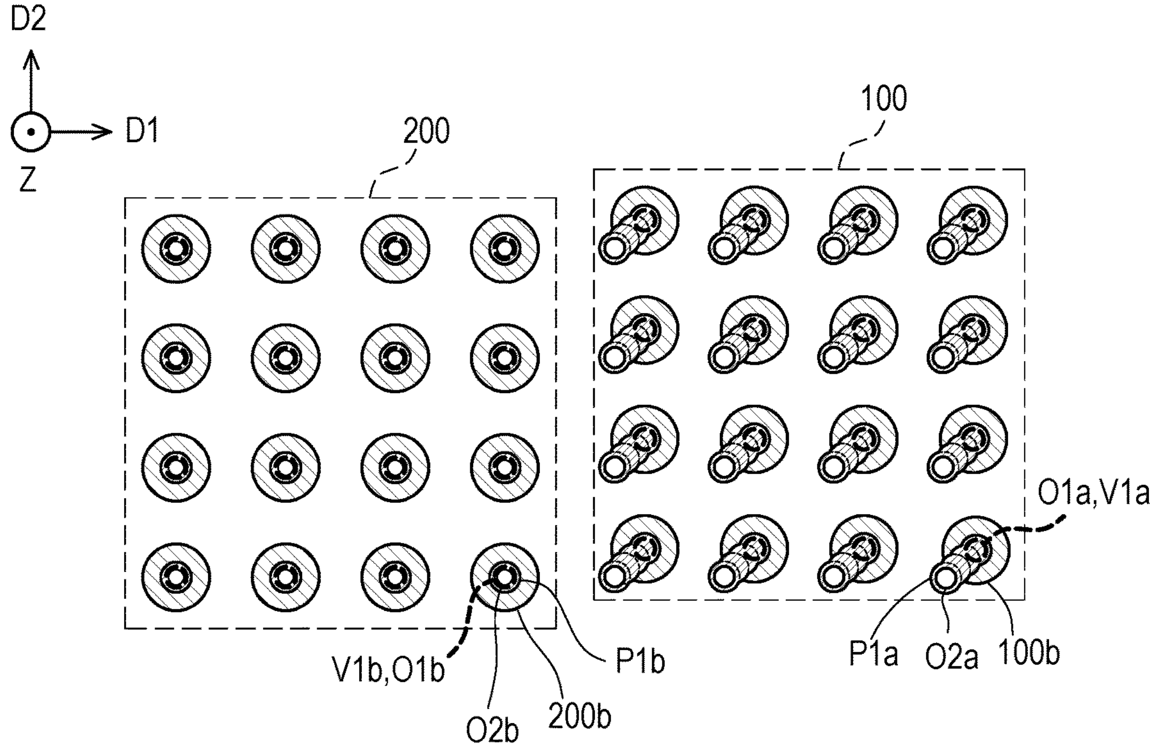

FIG. 3A to FIG. 3C are simplified enlarged top views illustrating a method of forming a portion of the structure of FIG. 1D according to some embodiments of the present disclosure. In FIG. 3A to FIG. 3C, the first die 100 is schematically depicted with die shift and the second die 200 is schematically depicted without die shift for simplicity of illustration.

Referring to FIG. 3A, after the grinding process is performed on the encapsulant material layer to form the dielectric encapsulation layer 106 (shown in FIG. 1A) exposing the die connectors (100*b* and 200*b*) of the first die 100 and the second die 200, the die shift (e.g., offsets values along direction D1 and direction D2, rotation values, magnification values or the like) of each die is obtained by taking images of all dies on the carrier 102 (shown in FIG. 1A) and back-end processing and calculation according to the alignment die(s) or alignment target positions. When die shift occurs to one or more of the dies, the amount of die shift correction of each die of the one or more of the dies is determined and feedforward to the corresponding process machines (e.g., exposure machines). In some embodiments, a by-die exposure to the first polymer layer and/or a stepper-based multi-exposure redistribution layer (RDL) rerouting approach applied to form the pads on the first polymer layer can be applied for die shift correction.

Specifically, referring to FIG. 3A, when the second die 200 has no die shift, and the first die 100 has die shift (e.g., X/Y shift +5/+5 μm, and rotation +20 μrad), by-die exposure process (or multi-exposure process; detail description will be provide later) can be adopted to make the via openings (e.g., first via openings Ola and second via openings O1*b*) of the first polymer layer (e.g., the first polymer layer PM1 in FIG. 1D) vertically aligned to the underlying die connectors 100*b* and 200*b* or to make the via openings (e.g., first via openings Ola) of the first polymer layer partially compensate the die shift (e.g., making positions of the first via openings Ola offset towards the global order location depicted in thin dashed lines, but still overlapped with the underlying die connectors 100*b* and 200*b*).

Referring to FIG. 3B, after the first polymer layer with the first via openings Ola and the second via openings O1*b* is formed, vias (e.g., V1*a* and V1*b*) are formed in the via openings (e.g., Ola and O1*b*) and pads (e.g., P1*a* and P1*b*) are formed on the first polymer layer. For example, the vias and the pads are formed by lining via openings (e.g., Ola and O1*b*) with a seed layer, forming a photoresist layer with pad openings, plating the metal features (the pads and the vias) from the seed layer, and removing the photoresist layer and the underlying seed layer.

The photoresist layer with pad openings can be formed by coating a photoresist material layer on the seed layer and patterning the photoresist material layer by multi-exposure with a single photomask (e.g., a via mask with a via array) followed by a development process. For example, to define the pad openings configured to dispose the pads (e.g., P1*b*) over the second die 200 that is without die shift, the via mask may be subject to one local exposure or a plurality of local exposures, wherein the position and the rotation angle of the photomask (via mask) is fixed (the same) in the plurality of local exposures. On the other hand, to define the pad openings configured to dispose the pads (e.g., P1*a*) over the first die 100 that is with die shift, the via mask is subject to a plurality of local exposures, wherein at least one of a position and a rotation angle of the photomask is changed in the plurality of local exposures for pad rerouting to global order. For example, for the first die 100 with die shift of X/Y shift +5/+5 μm and rotation +20 μrad, the via array are vertically aligned to the underlying via openings (e.g., Ola) during the first exposure among the plurality of local exposures, and then, the photomask is shifted by −1 μm/−1 μm along X/Y coordinates and rotated by −4 μrad for each of the next five exposures to define the pad openings in the photoresist material layer having shapes corresponding to those of the pads (e.g., P1*a*). In FIG. 3B, the positions of the via array among the plurality of local exposures are depicted in a thin dashed line for ease of understanding. After all the pad openings are defined in the photoresist material layer through the local exposures, the development process is performed to form the photoresist layer with the pad openings having shapes corresponding to those of the pads (e.g., P1*a*, P1*b*).

Since the via openings (e.g., first via openings Ola and second via openings O1*b*) of the first polymer layer (e.g., the first polymer layer PM1 in FIG. 1D) are formed by the by-die exposure process (regions of the first polymer layer PM1 corresponding to different dies are subject to exposures separately), not only the first vias V1*a* can be vertically aligned to the underlying die connectors 100*b*, but also the second vias V1*b* can be vertically aligned to the underlying die connectors 200*b*. The by-die exposure process enables the vias to land directly on the die connectors, and thus the pitch limitation can be reduced; or critical dimensions of the vias landing on the die connectors of the dies can be enlarged under the same pitch limitation for reliability improvement (reduce crack).

Referring to FIG. 3C, after the pads (e.g., P1*a*, P1*b*) are rerouting to global order, the layers above the first metal feature layer (e.g., P1*a*, P1*b*, V1*a*, V1*b*) can return to global alignment and/or global exposure. For example, the second polymer layer (e.g., the second polymer layer PM2 in FIG. 1D) with via openings (e.g., O2*a*, O2*b*) can be formed on the first metal feature layer by global exposure process (a single exposure is performed for all dies on the carrier; detail description will be provide later), and the third via openings O2*a* overlapped with the first die 100 may be aligned to the fourth via openings O2*a* overlapped with the second die 200 along direction D1.

In FIG. 3A to FIG. 3C, the die shift of the first die 100 includes shifts along directions D1 and D2 and rotation, and thus, the pads (e.g., P1*a*) overlapped with the die (e.g., the first die 100) with die shift are different in shapes, sizes and extension directions, but the disclosure is not limited thereto. FIG. 3C' is another simplified enlarged top view illustrating a portion of the structure of FIG. 1D according to some embodiments of the present disclosure. Referring to FIG. 3C', when the die shift of the die (e.g., the first die 100) includes shifts along directions D1 and D2 and without rotation, the pads (e.g., P1*a*) overlapped with the die (e.g., the first die 100) with die shift may be the same in shapes, sizes and extension directions.

Figure 4:
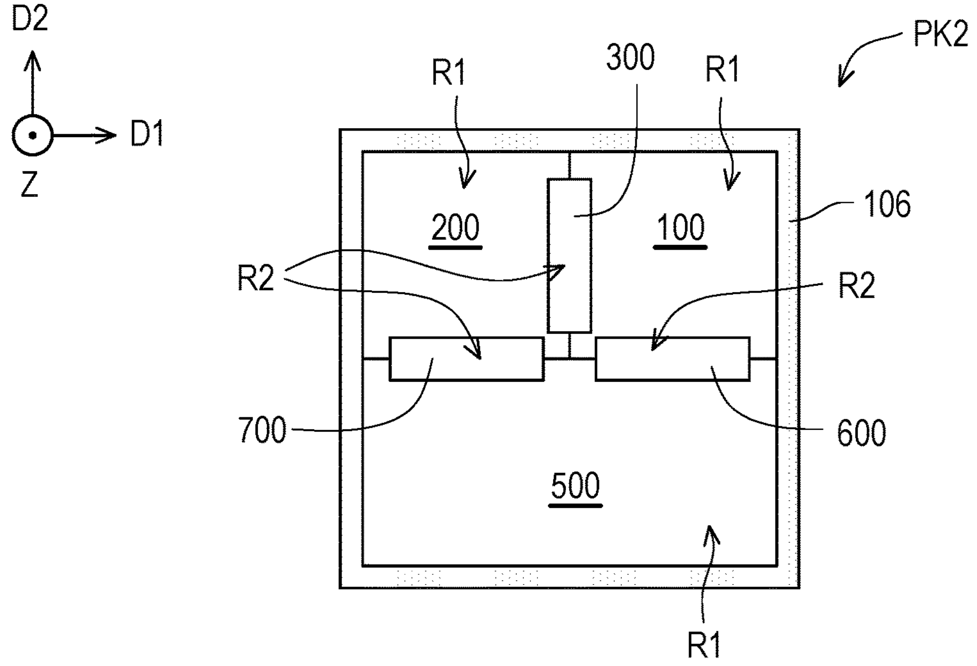
FIG. 4 is a simplified enlarged top view illustrating a semiconductor package according to some embodiments of the present disclosure.

FIG. 4 is a simplified enlarged top view illustrating a semiconductor package according to some embodiments of the present disclosure. In FIG. 4, the semiconductor package PK2 includes a first die 100, a second die 200 and a third die 500 that are packaged by the dielectric encapsulation layer 106. The semiconductor package PK2 further includes a bridge die 300 for electrical connection between the first die 100 and the second die 200, a bridge die 600 for electrical connection between the first die 100 and the third die 500, and a bridge die 700 for electrical connection between the second die 200 and the third die 500. However, the number of the dies may be adjusted or modified based on the product design and are not limited by the present disclosure.

The manufacturing methods of the first polymer layer, the first metal feature layer and the second polymer layer in the semiconductor package PK2 will be described with references to FIG. 5 through FIG. 10. In the following descriptions, regions of the dies (e.g., 100, 200, 500) occupied by the bridge dies (e.g., 30, 600, 700) are called bridge regions R2, and regions of the dies not occupied by the bridge dies are called core regions R1.

Figure 5:
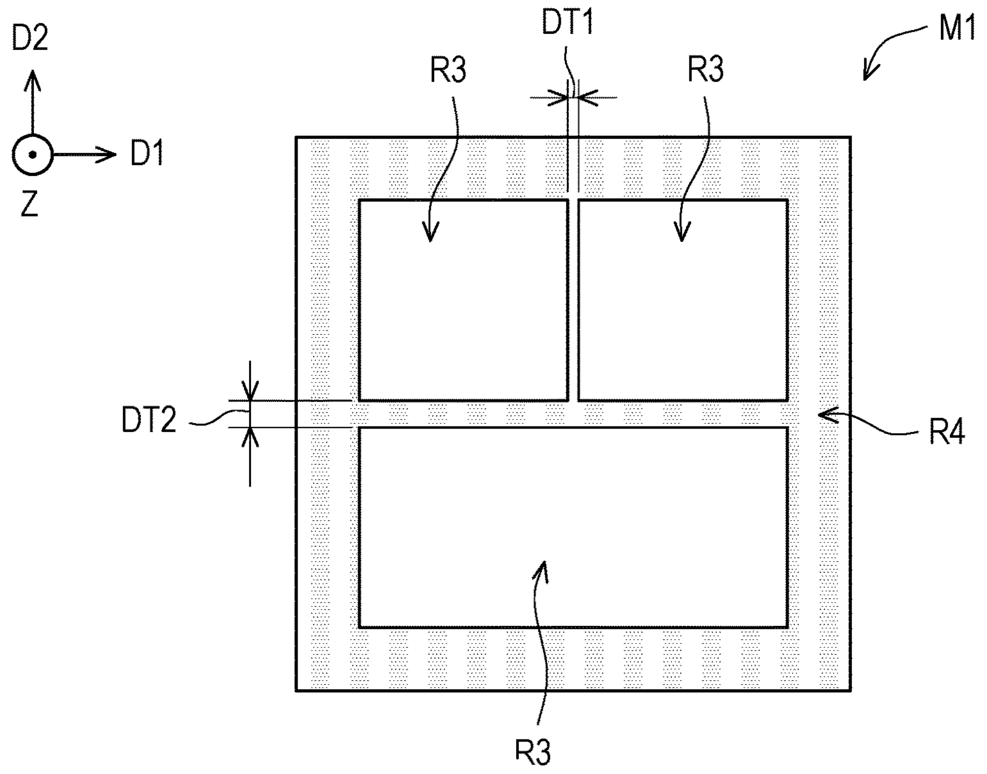
FIG. 5 is a simplified enlarged top view illustrating a photomask for forming a first polymer layer of the redistribution layer structure of FIG. 4 according to some embodiments of the present disclosure.
Figure 6A:
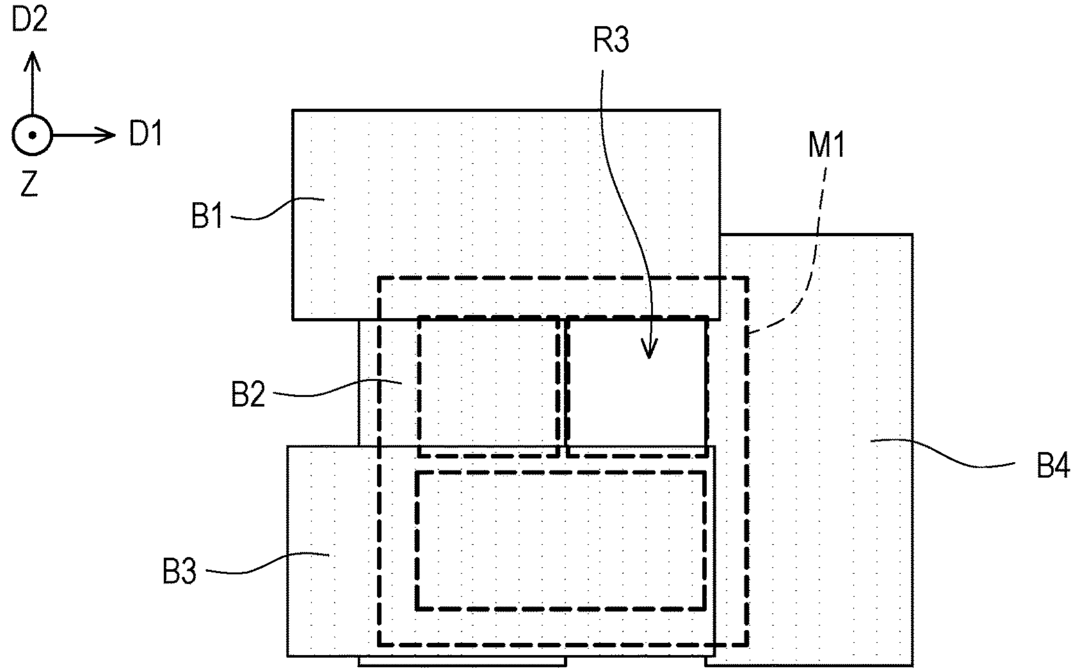
FIG. 6A to FIG. 6C are simplified enlarged top views illustrating a method of forming the first polymer layer of the redistribution layer structure of FIG. 4 according to some embodiments of the present disclosure.
Figure 6B:
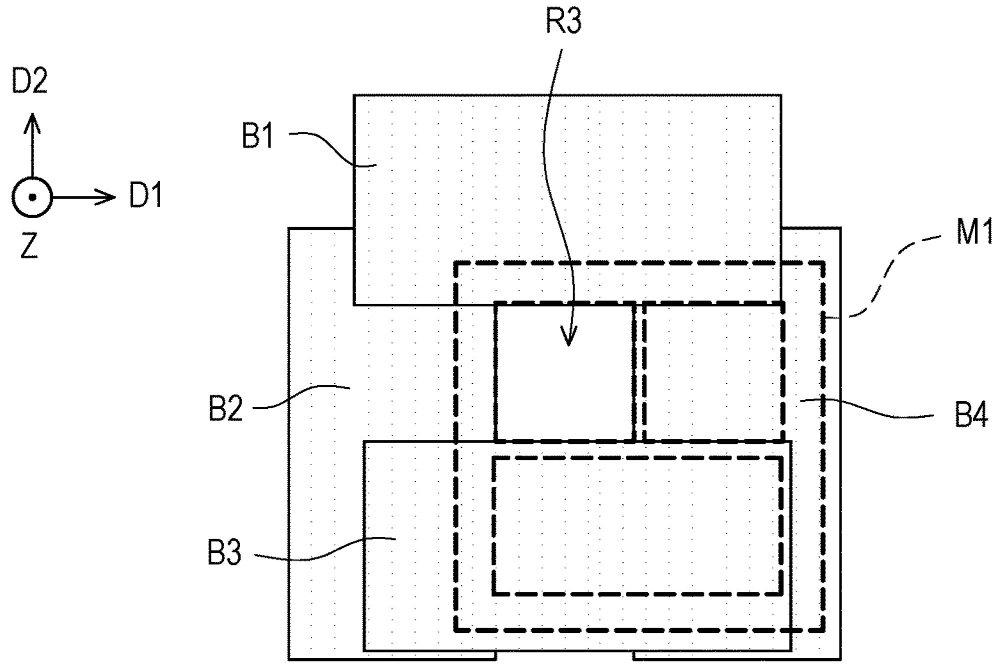
Figure 6C:
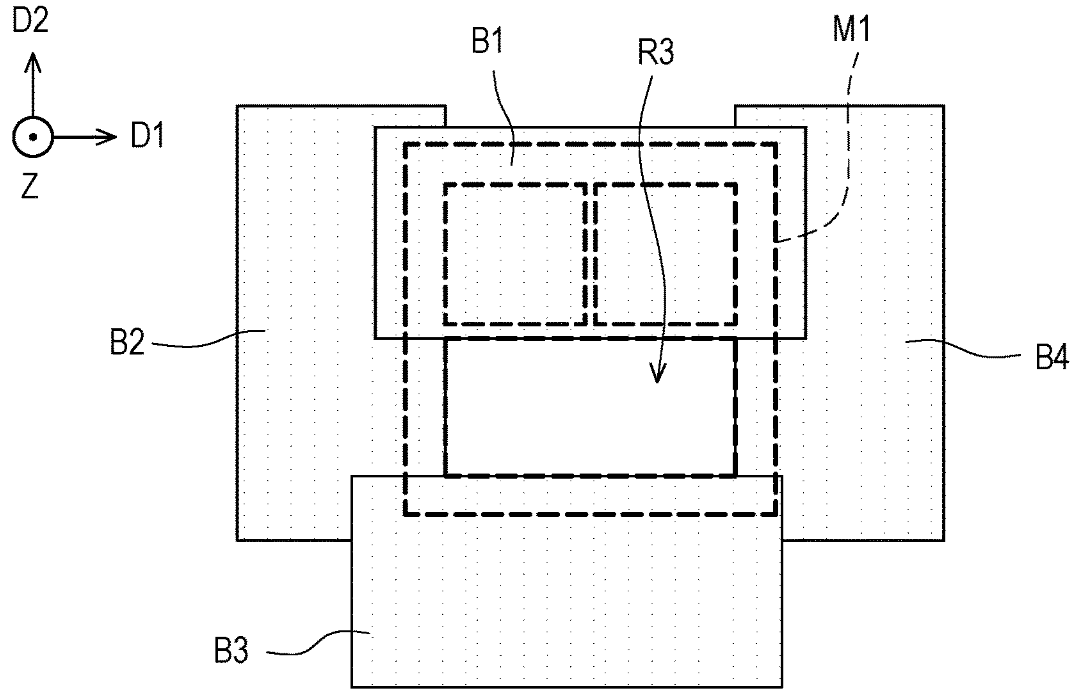
Figure 7:
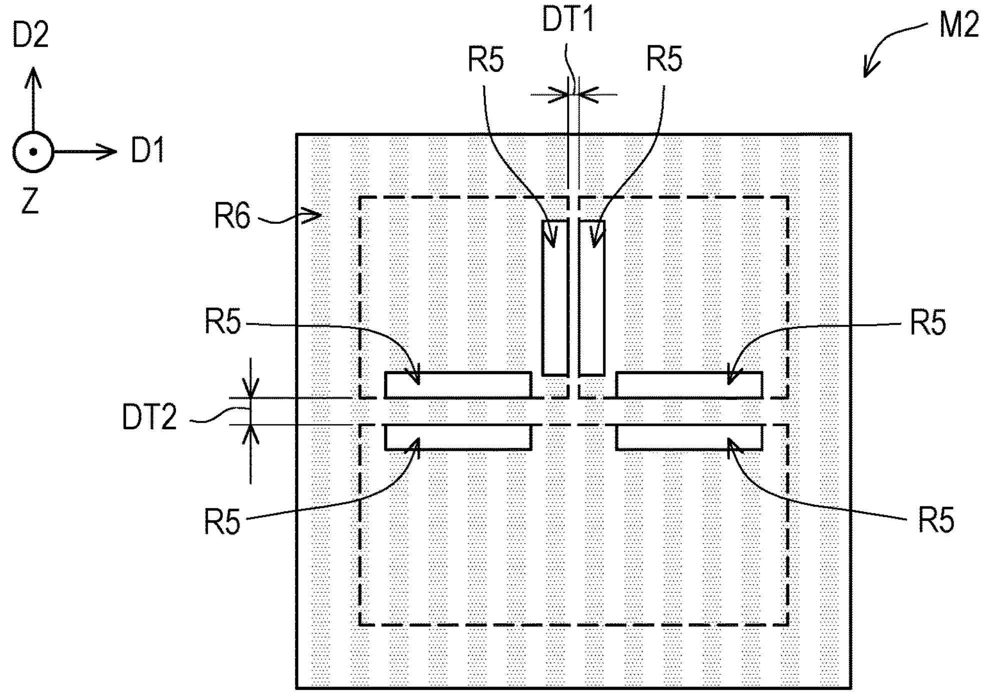
FIG. 7 is a simplified enlarged top view illustrating a photomask for forming pads and bottommost vias of the redistribution layer structure in bridge regions of FIG. 4 according to some embodiments of the present disclosure.
Figure 9:
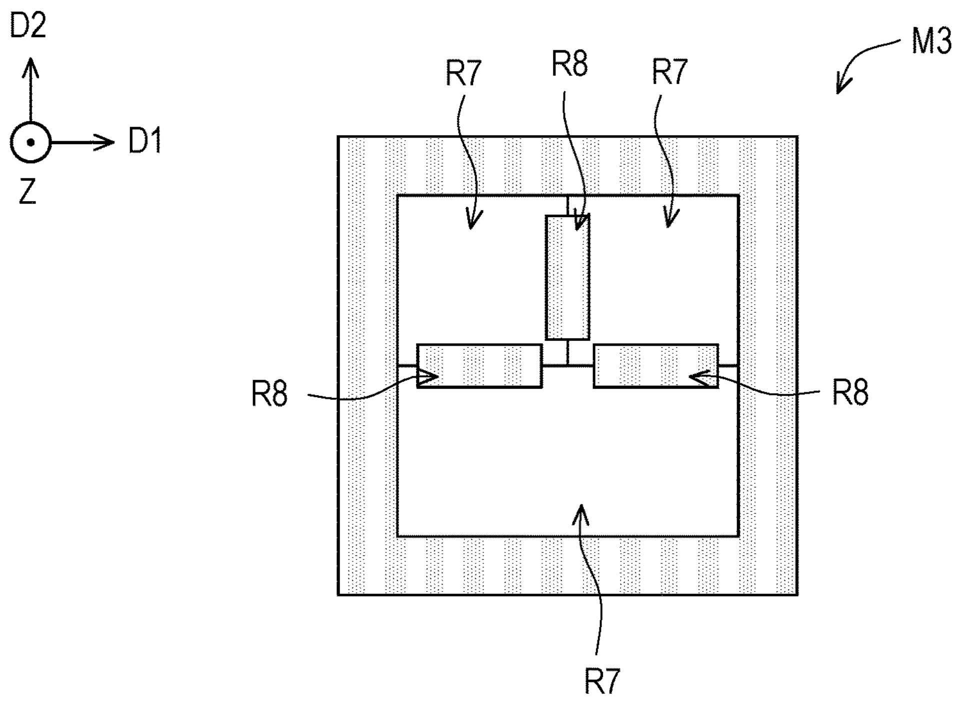
FIG. 9 is a simplified enlarged top view illustrating a photomask for forming bottommost lines and bottommost vias of the redistribution layer structure in core regions of FIG. 4 according to some embodiments of the present disclosure.
Figure 10:
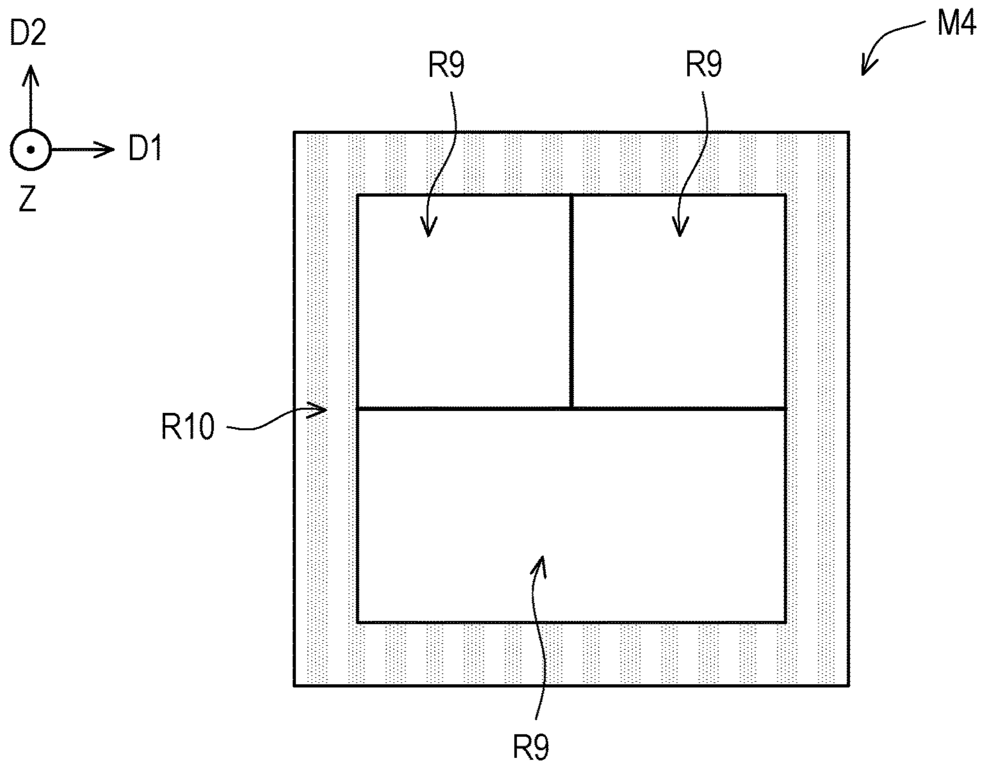
FIG. 10 is a simplified enlarged top view illustrating a photomask for forming a layer above the bottommost lines and the pads of FIG. 4 according to some embodiments of the present disclosure.

FIG. 5 is a simplified enlarged top view illustrating a photomask for forming a first polymer layer of the redistribution layer structure of FIG. 4 according to some embodiments of the present disclosure. FIG. 6A to FIG. 6C are simplified enlarged top views illustrating a method of forming the first polymer layer of the redistribution layer structure of FIG. 4 according to some embodiments of the present disclosure. FIG. 7 is a simplified enlarged top view illustrating a photomask for forming pads and bottommost vias of the redistribution layer structure in bridge regions of FIG. 4 according to some embodiments of the present disclosure. FIG. 8A to FIG. 8H are simplified enlarged top views illustrating a method of forming the pads and bottommost vias of the redistribution layer structure in bridge regions of FIG. 4 according to some embodiments of the present disclosure. FIG. 9 is a simplified enlarged top view illustrating a photomask for forming bottommost lines and bottommost vias of the redistribution layer structure in core regions of FIG. 4 according to some embodiments of the present disclosure. FIG. 10 is a simplified enlarged top view illustrating a photomask for forming a layer above the bottommost lines and the pads of FIG. 4 according to some embodiments of the present disclosure.

Referring to FIG. 5, the photomask M1 for forming a first polymer layer (e.g., the first polymer layer PM1 in FIG. 1D) of the redistribution layer structure may include light exposure regions R3 respectively corresponding to the dies (e.g., the first die 100, the second die 200 and the third die 500 shown in FIG. 4) and a non-light exposure region R4 laterally surrounding the light exposure regions R3. In some embodiments, adjacent light exposure regions R3 may be separated from each other by a first distance DT1 along direction D1 and by a second distance DT2 along direction D2 for multi-exposure process with masking blades (e.g., masking blades B1 to B4 in FIG. 6A to FIG. 6C). In some embodiments, the first distance DT1 is different from the second distance DT2. In some embodiments, the first distance DT1 is smaller than the second distance DT2. In some embodiments, the first distance DT1 is 3 μm, and the second distance DT2 is 5 μm, but the disclosure is not limited thereto.

Referring to FIG. 6A to FIG. 6C, a multi-exposure process (or a by-die exposure process) is performed. Specifically, the light exposure regions R3 of the photomask M1 corresponding to different dies are subject to exposures (or light exposures) separately by, for example, using a plurality of masking blades (e.g., masking blades B1 to B4) configured to shield regions of the photomask M1 not intended to be exposed by light.

After the photomask M1 is located over a non-patterned first polymer layer formed on the structure shown in FIG. 1A and the light exposure regions R3 are respectively corresponding to (overlapped with) the dies, the light exposure regions R3 of the photomask M1 are subject to light exposure separately, so that regions of the non-patterned first polymer layer respectively overlapped with the dies are respectively subject to a first exposure, a second exposure and a third exposure, wherein the first exposure, the second exposure and the third exposure are performed separately, and the first exposure, the second exposure and the third exposure are performed with a single photomask (e.g., the photomask M1) and a plurality of masking blades (e.g., masking blades B1 to B4). After all the light exposure regions R3 are subject to exposure, a development process may be performed so as to form a first polymer layer (e.g., the first polymer layer PM1 in FIG. 1D) with via openings (e.g., first via openings Ola and second via openings O1*b* in FIG. 3A).

Referring to FIG. 7 and FIG. 9, the photomask M2 for forming pads (e.g., P1*a*, P1*b* in FIG. 1D or P1*a*, P1*b*, Plc in FIG. 2B) and bottommost vias (e.g., V1*a*, V1*b* in FIG. 1D or V1*a*, V1*b*, V1*c* in FIG. 2B) in bridge regions R2 of FIG. 4 is provided in FIG. 7, and the photomask M3 for forming bottommost lines (e.g., L1 in FIG. 1D) and bottommost vias (e.g., V1 in FIG. 1D) in core regions R1 of FIG. 4 are provided. Specifically, the photomask M2 is configured to define pad openings corresponding to the pads (e.g., P1*a*, P1*b*, Plc in FIG. 2B or P1*a*, P1*b* in FIG. 3B or FIG. 1B) in a non-patterned photoresist material layer, and the photomask M3 is configured to define line openings corresponding to the lines (e.g., lines L1 in FIG. 1B) in the non-patterned photoresist material layer.

Specifically, the photomask M2 may include light exposure regions R5 respectively corresponding to the bridge dies (e.g., the bridge die 300, the bridge die 600 and the bridge die 700 shown in FIG. 4) and a non-light exposure region R6 laterally surrounding the light exposure regions R5. In some embodiments, adjacent light exposure regions R5 may be separated from each other by a first distance DT1 along direction D1 and by a second distance DT2 along direction D2 for multi-exposure process with masking blades (e.g., masking blades B1 to B4 in FIG. 8A to FIG. 8H). In some embodiments, the first distance DT1 is different from the second distance DT2. In some embodiments, the first distance DT1 is smaller than the second distance DT2. In some embodiments, the first distance DT1 is 3 μm, and the second distance DT2 is 5 μm, but the disclosure is not limited thereto.

Referring to FIG. 8A to FIG. 8H, a multi-exposure process (or a by-die exposure process) is performed. Specifically, the light exposure regions R5 of the photomask M2 corresponding to different dies are subject to exposures separately by, for example, using a plurality of masking blades (e.g., masking blades B1 to B4) configured to shield regions of the photomask M2 not intended to be exposed by light.

After the photomask M2 is located over a non-patterned photoresist material layer formed on a non-patterned seed layer (as described in FIG. 3B) and the light exposure regions R5 are respectively corresponding to bridge regions of the dies, the light exposure regions R5 of the photomask M2 corresponding to different dies are subject to exposures separately, and the light exposure regions R5 of the photomask M2 corresponding the die with die shift adopt stepper-based multi-exposure redistribution layer rerouting approach for die shift correction.

Figure 8A:
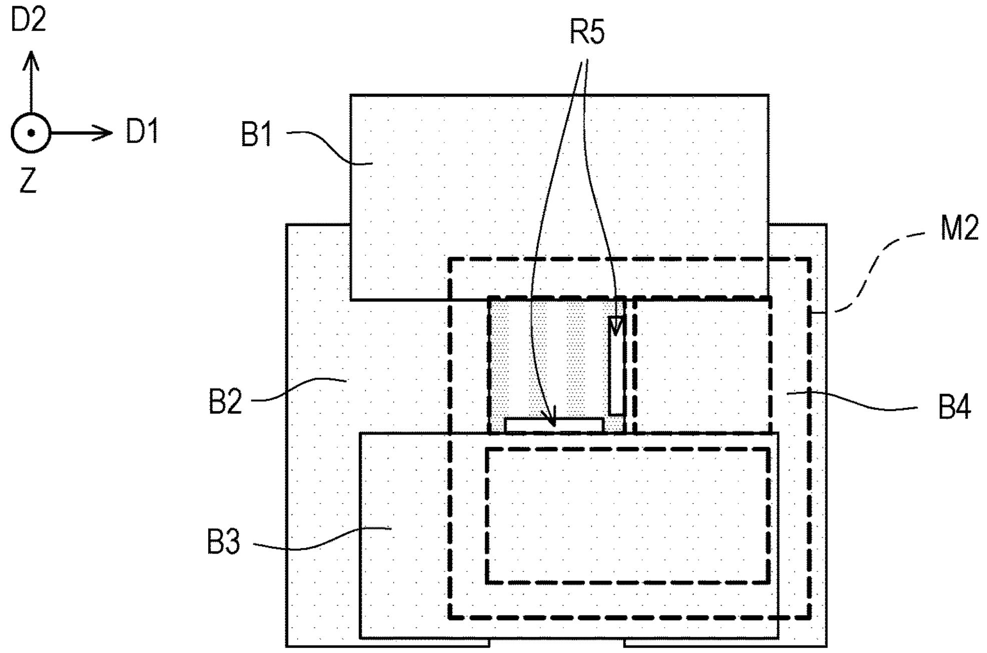
FIG. 8A to FIG. 8H are simplified enlarged top views illustrating a method of forming the pads and bottommost vias of the redistribution layer structure in bridge regions of FIG. 4 according to some embodiments of the present disclosure.
Figure 8B:
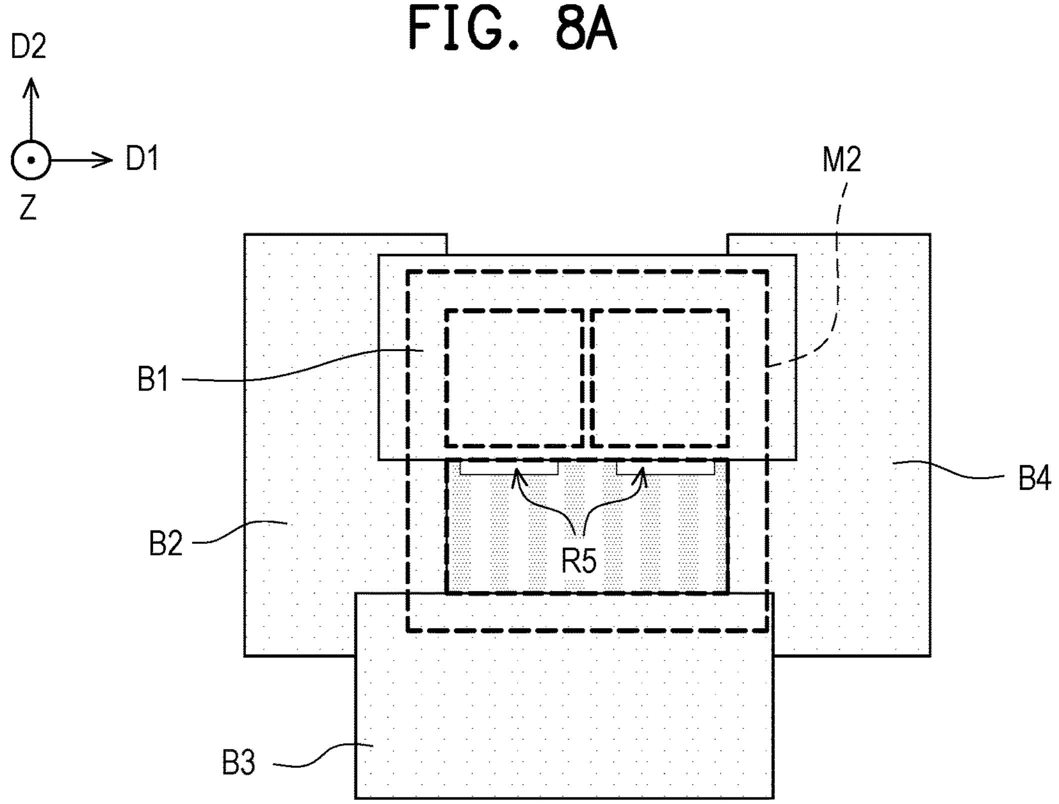
Figure 8C:
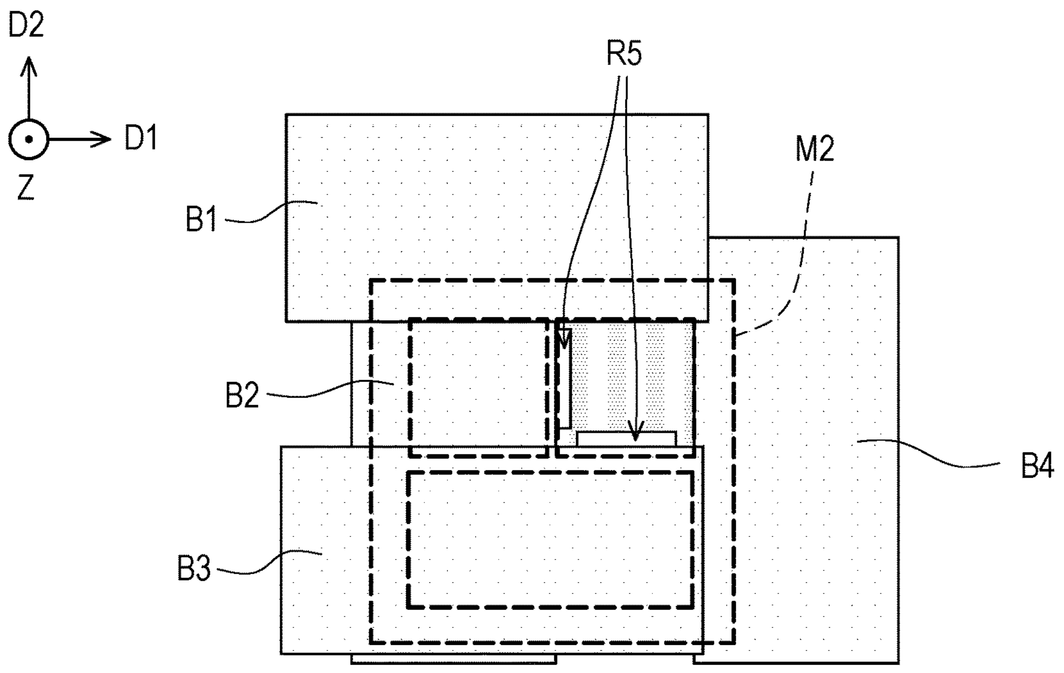
Figure 8D:
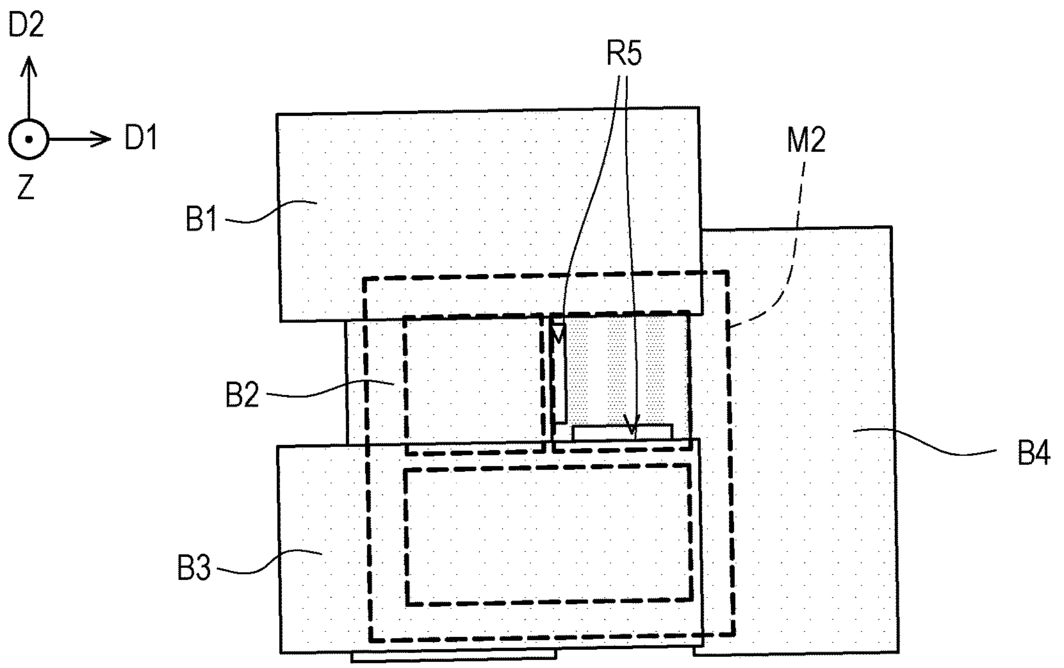
Figure 8E:
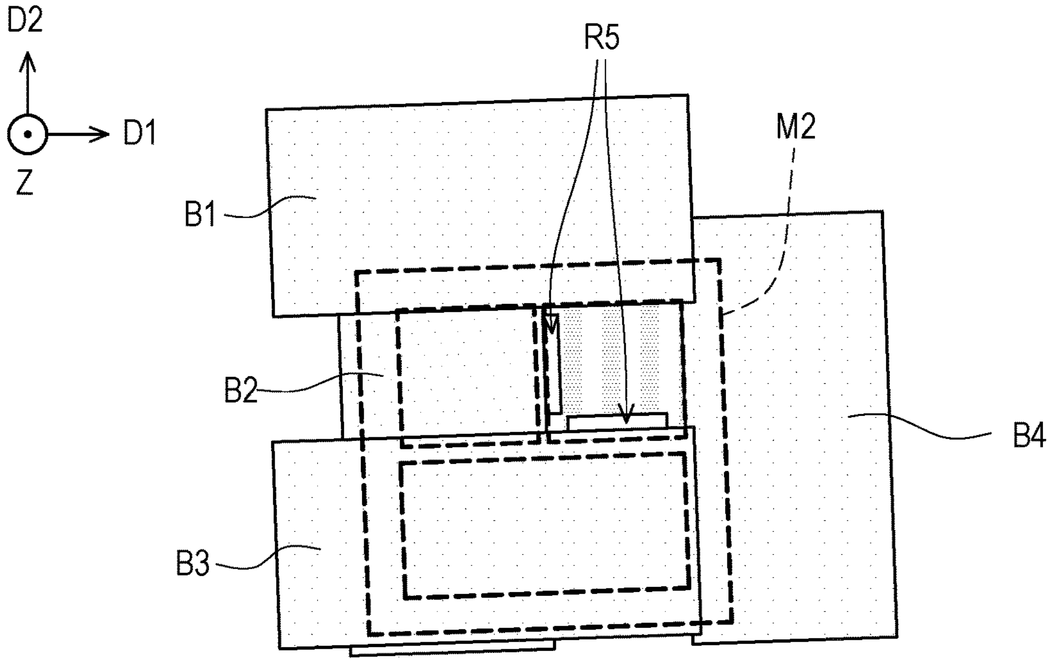
Figure 8F:
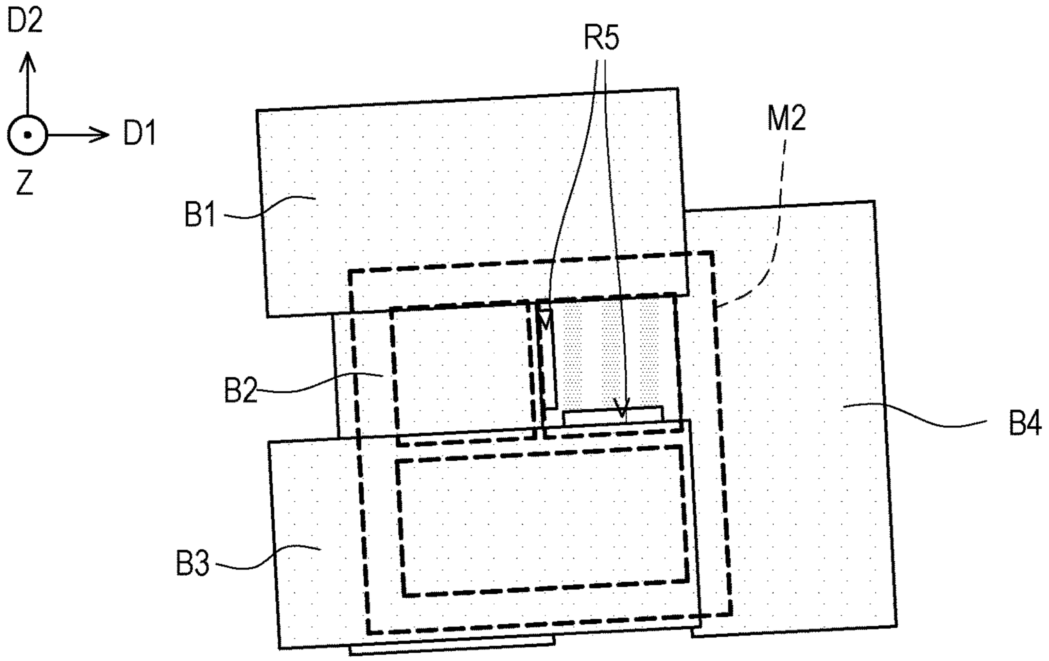
Figure 8G:
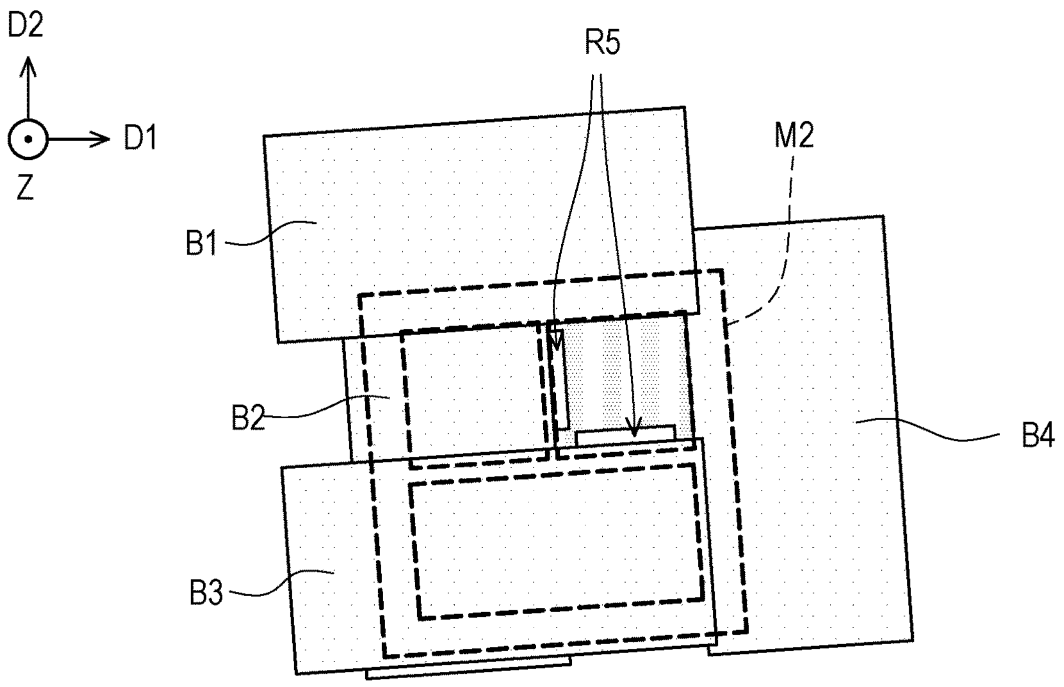
Figure 8H:
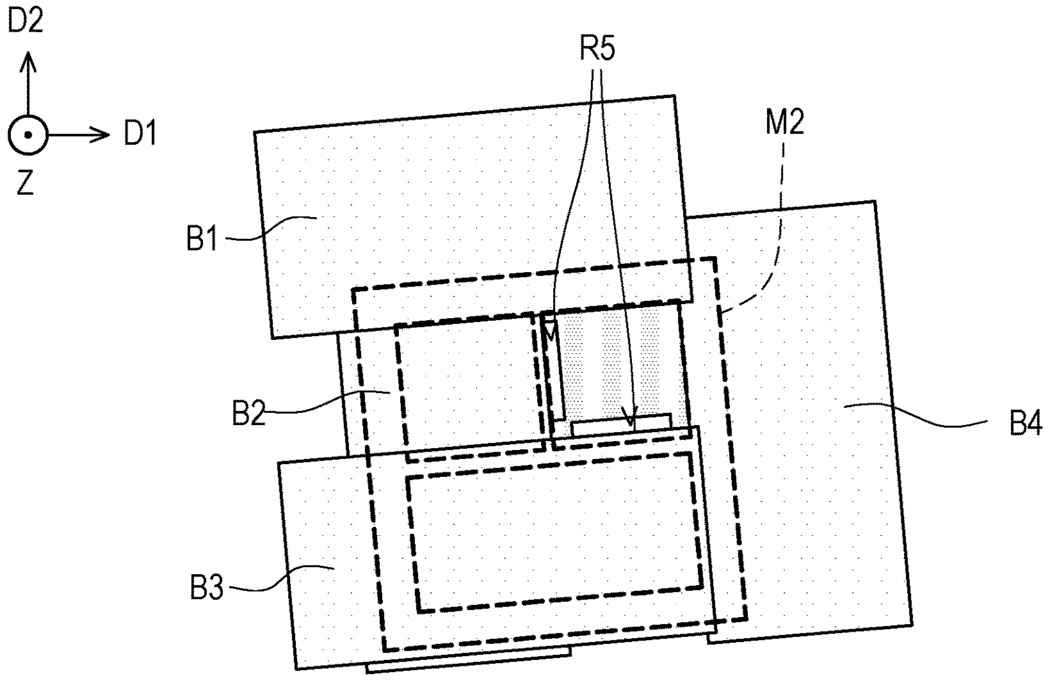

For example, when the second die 200 and the third die 500 (shown in FIG. 4) have no die shift, and the first die 100 has die shift, regions of the photoresist material layer overlapped with the light exposure regions R5 corresponding to the second die 200 (or the third die 500) may be subjected to a single exposure or a plurality of exposures without changing the relative disposition (e.g., X/Y coordinates and/or rotation angles) between the photomask M2 and the carrier, as shown in FIG. 8A (or FIG. 8B), while regions of the photoresist material layer overlapped with the light exposure regions R5 corresponding to the first die 100 are subjected to a plurality of exposures separately, and the relative disposition (e.g., X/Y coordinates and/or rotation angles) between the photomask M2 and the carrier is changed for each of the plurality of exposures, for example, at least one of a position and a rotation angle of the photomask M2 (or the carrier) is changed in the plurality of exposures. Take the first die 100 with die shift of X/Y shift +5/+5 μm and rotation +20 μrad as an example, the via array in the light exposure regions R5 may be vertically aligned to the underlying via openings (e.g., Ola in FIG. 3B) during the first exposure among the plurality of exposures, and then, the photomask M2 as well as the masking blades B1 to B4 are shifted by −1 μm/−1 μm along X/Y coordinates and rotated by −4 μrad for each of the next five exposures to define the pad openings in the photoresist material layer having shapes corresponding to those of the pads (e.g., P1*a* in FIG. 3B). Note that the shift and/or rotation amount for each of the plurality of exposures may be the same or different based on needs, and this disclosure is intended to cover any feasible amount of shift and/or rotation.

Referring to FIG. 9, before or after the regions of the photoresist material layer overlapped with the light exposure regions R5 corresponding to different dies are all subject to exposures, the photomask M3 is applied to define line openings corresponding to the lines (e.g., lines L1 in FIG. 1B) in the non-patterned photoresist material layer.

Specifically, the photomask M3 may include light exposure regions R7 respectively corresponding to the core regions R1 (shown in FIG. 4) of the dies and a non-light exposure region R8 laterally surrounding the light exposure regions R7. A global exposure process may be performed to the light exposure regions R7 to define line openings in regions of the non-patterned photoresist material layer that are corresponding to the light exposure regions R7, namely, all the line openings corresponding to the core regions R1 (shown in FIG. 4) of the dies can be defined by a single exposure process with a single photomask M3 and without any masking blades.

After pad openings and line openings are defined in the non-patterned photoresist material layer through the above exposure processes, a development process may be performed so as to form the photoresist layer with pad openings and line openings. Then, the pads (e.g., P1*a*, P1*b* in FIG. 1D or P1*a*, P1*b*, Plc in FIG. 2B), the bottommost lines (e.g., L1 in FIG. 1D) and the bottommost vias (e.g., V1 in FIG. 1D) can be formed by plating the metal features (the pads, the bottommost lines and the bottommost vias) from the seed layer and removing the photoresist layer and the underlying seed layer.

Since the die shift correction is completed by the first metal feature layer (including the vias in the first polymer layer and the pads on the first polymer layer), the layers above the first metal feature layer can return to global alignment and/or global exposure; therefore, enabling to reduce alignment complexity for stacking of metal features and polymer layers and/or decrease the seam risk for negative-tone polymer layers (e.g., low-temperature curable negative-tone photosensitive polyimide). And thus, providing better overlay management, ensuring manufacturing time/cost and/or ensuring price competitiveness. For example, referring to FIG. 10, the photomask M4 for forming a second polymer layer (e.g., the second polymer layer PM2 in FIG. 1D) or other layer above the first metal feature layer of the redistribution layer structure may include light exposure regions R9 respectively corresponding to the dies (e.g., the first die 100, the second die 200 and the third die 500 shown in FIG. 4) and a non-light exposure region R10 laterally surrounding the light exposure regions R9. A global exposure process may be performed to the light exposure regions R9 to define via openings in regions of a non-patterned second polymer layer that are corresponding to the light exposure regions R9, namely, all the via openings corresponding to the dies can be defined by a single exposure process with a single photomask M4 and without any masking blades. All the layers of the redistribution layer structure above the first metal feature layer can use the global alignment and/or global exposure approach, and thus the detail is omitted herein.

Figure 11:
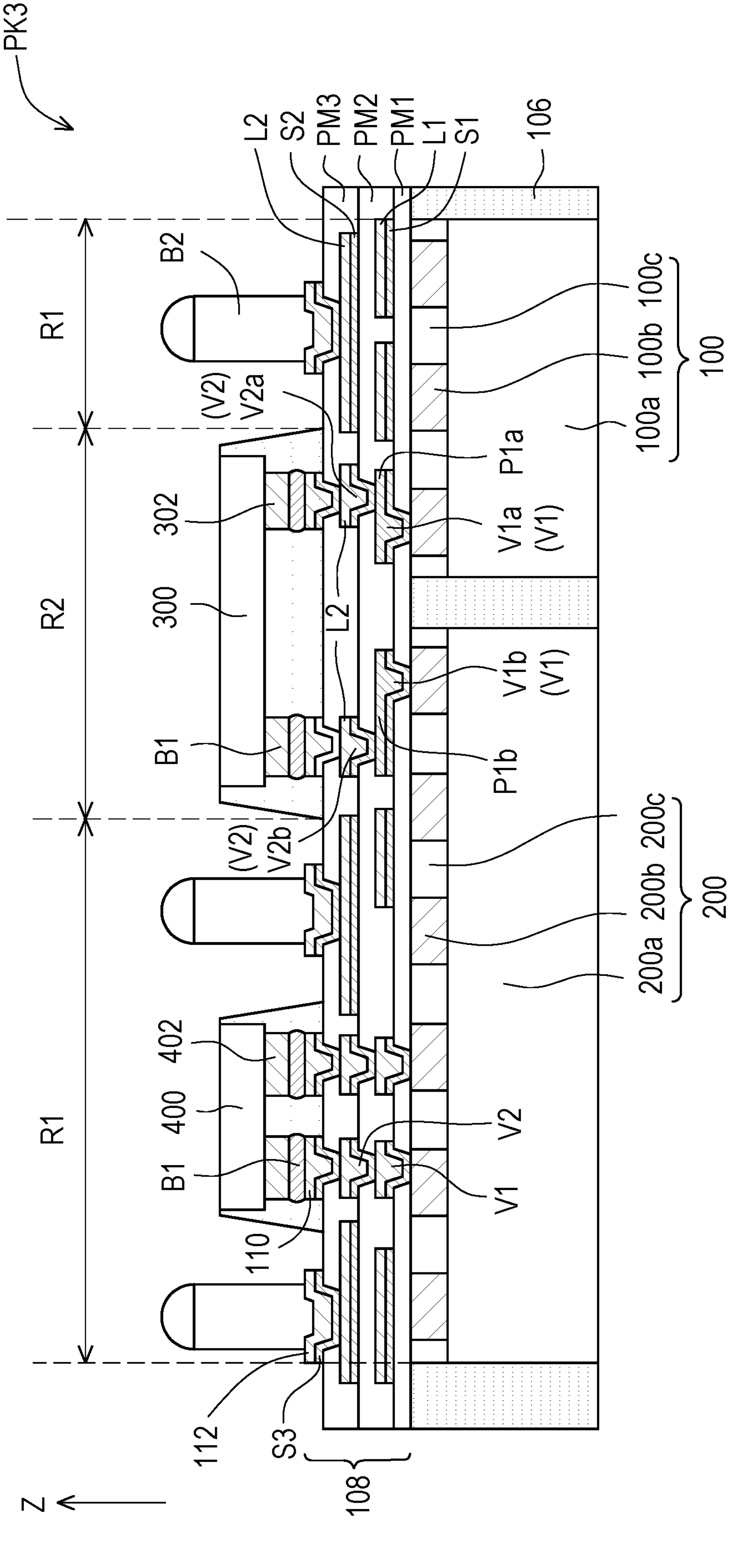
FIG. 11 is a schematic cross-sectional view illustrating a semiconductor package according to some embodiments of the present disclosure.

FIG. 11 is a schematic cross-sectional view illustrating a semiconductor package according to some embodiments of the present disclosure. Referring to FIG. 11, the main differences between the semiconductor package PK3 and the semiconductor package PK1 in FIG. 1D are illustrated below.

In the semiconductor package PK3, the first via V1*a* and the third via V2*a* are staggered vias respectively located on opposite surfaces of the first pad P1*a*, the second via V12*b* and the fourth via V2*b* are staggered vias respectively located on opposite surfaces of the second pad P1*b*, and from the top view, a distance between the first via V1*a* and the third via V2*a* is different from a distance between the second via V1*b* and the fourth via V2*b*.

Figure 12A:
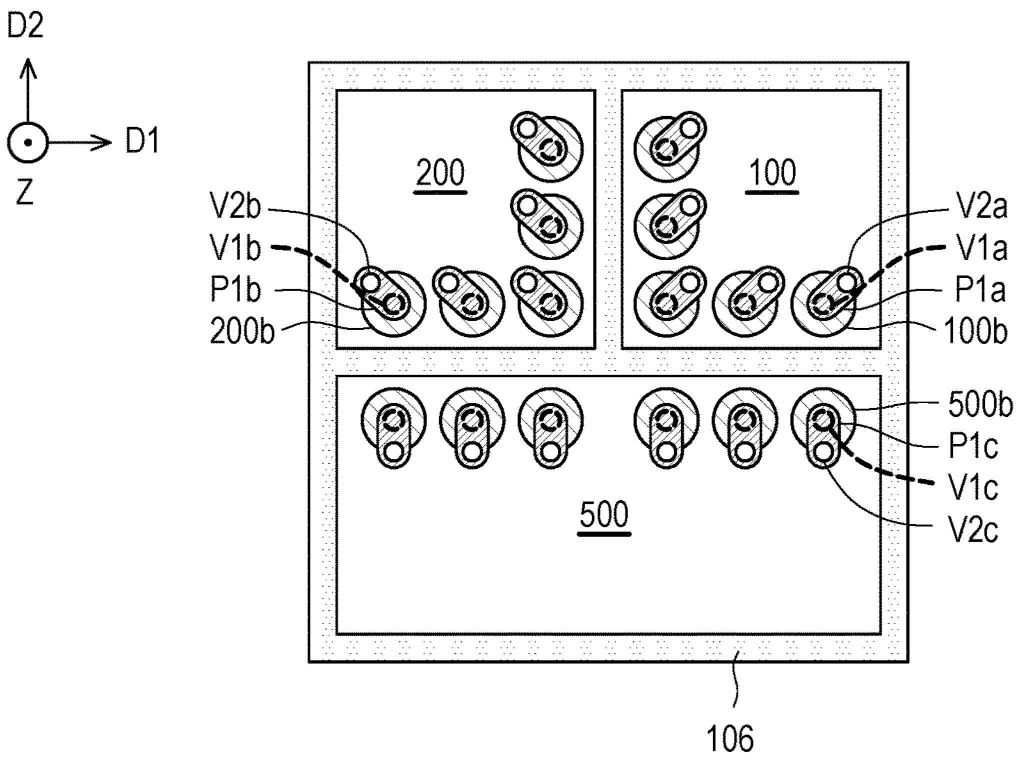
FIG. 12A and FIG. 12B are simplified enlarged top views illustrating semiconductor packages with and without die shift in the case of staggered vias.
Figure 12B:
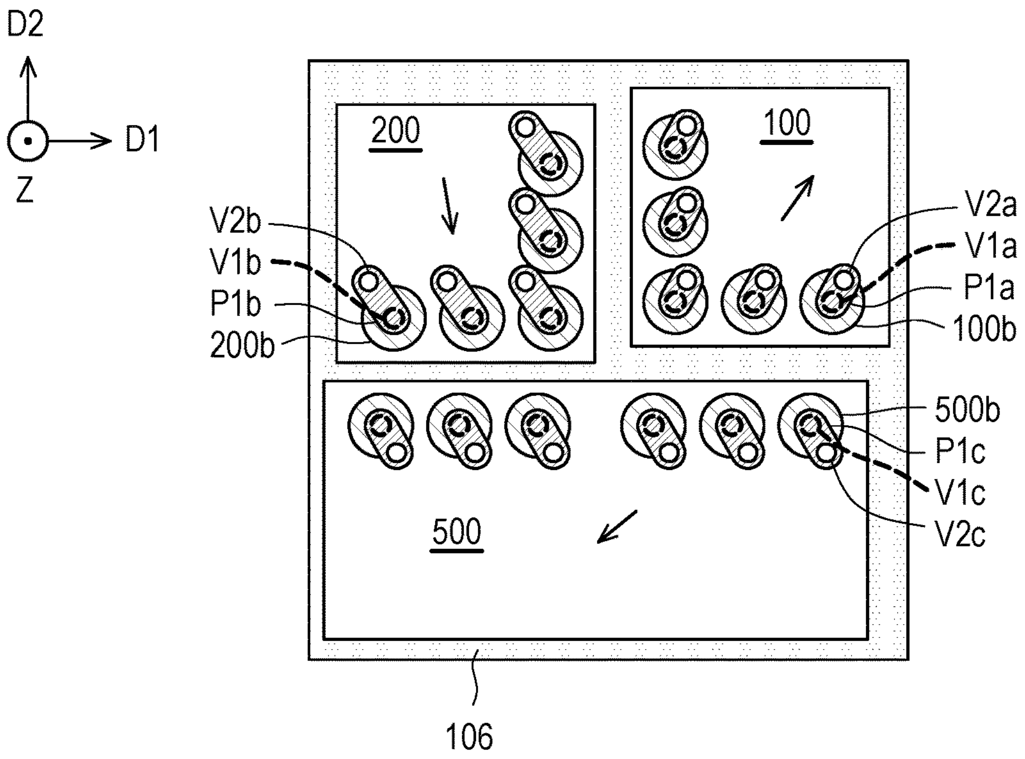

Take FIG. 12A and FIG. 12B as example. FIG. 12A and FIG. 12B are simplified enlarged top views illustrating semiconductor packages with and without die shift in the case of staggered vias. In FIG. 12A and FIG. 12B, each semiconductor package includes a first die 100, a second die 200 and a third die 500 that are packaged by the dielectric encapsulation layer 106. However, the number of the dies may be adjusted or modified based on the product design and are not limited by the present disclosure. For illustration purposes, die connectors 100*b*, 200*b*, 500*b* of the dies, vias (e.g., V1*a*, V1*b* and V1*c*) located in the first polymer layer (e.g., the first polymer layer PM1 shown in FIG. 11), pads (e.g., P1*a*, P1*b*, Plc) disposed on the first polymer layer and vias (e.g., V2*a*, V2*b* and V2*c*) located in the second polymer layer (e.g., the second polymer layer PM2 shown in FIG. 11) are shown in FIG. 12A and FIG. 12B, while other elements of the semiconductor packages are omitted.

For an ideal staggered vias case of chip-first schemes, as shown in FIG. 12A, no die shift occurs to the dies in the semiconductor package, and die connectors 100*b*, 200*b*, 500*b* of the dies are aligned along direction D1 and direction D2. The vias (e.g., V1*a*, V1*b* and V1*c*) located in the first polymer layer are designed to be vertically aligned (aligned along direction Z) to the underlying die connectors 100*b*, 200*b*, 500*b*. The pads (e.g., P1*a*, P1*b*, Plc) disposed on the first polymer layer and overlapped with different dies are designed to be equal in length and extend beyond the underlying die connectors 100*b*, 200*b*, 500*b*. The vias (e.g., V2*a*. V2*b* and V2*c*) are designed to be located on opposite sides of the underlying pads (e.g., P1*a*, P1*b*, Plc) from the vias (e.g., V1*a*, V1*b* and V1*c*).

However, in a practical staggered vias case of chip-first schemes, as shown in FIG. 12B, die shift occurs to the dies in the semiconductor package during, for example but not limited to, pick and place processes, molding and/or grinding processes. Arrows in FIG. 12B denote the die shift direction of the dies (including the first die 100, the second die 200 and the third die 500). Due to the die shift, die connectors of different dies are not aligned along direction D1 and direction D2. For example, as shown in FIG. 2B, die connectors 100*b* and die connectors 200*b* are not aligned along direction D1, die connectors 100*b* and die connectors 500*b* are not aligned along direction D2, and die connectors 200*b* and die connectors 500*b* are not aligned along direction D2.

In some embodiments, based on the considerations of manufacturing time or cost, reliability of the vias (e.g., V1*a*, V1*b* and V1*c*), alignment complexity, overlay limitation, pitch limitation, price competitiveness, size miniaturization or the like, the first metal feature layer (including P1*a*, P1*b*, Plc, V1*a*, V1*b* and V1*c*) of the redistribution layer structure are used for die shift correction, so that layers above the first metal feature layer can return to global alignment (a single exposure is performed for all dies on the carrier).

Specifically, the vias (e.g., V1*a*, V1*b* and V1*c*) may be formed to land on the die connectors 100*b*, 200*b*, 500*b*. In some embodiments, the vias (e.g., V1*a*, V1*b* and V1*c*) are vertically aligned to (directly over) the die connectors 100*b*, 200*b*, 500*b*, but not limited thereto. The pads (e.g., P1*a*, P1*b*, Plc) may be formed of elongated pads, so that the overlying vias (e.g., V2*a*, V2*b* and V2*c*) that are bridged to the vias (e.g., V1*a*, V1*b* and V1*c*) by the pads (e.g., P1*a*, P1*b*, Plc) can be aligned along direction D1 and direction D2.

The shape of each pad is related to the die shift of the corresponding/overlapped die. The greater the die shift, the greater the die shift correction. The greater the die shift correction, the longer the pad, so the shape of the pad may be change from circular (see FIG. 12A) or circle-like to elliptical or elliptical-like. In some embodiments, as shown in FIG. 12B, from the top view, the pads overlapped with the same die may have the same shape, and the pads overlapped with different dies have different shapes. For example, the first pads P1*a* overlapped with the first die 100 have the same shape (e.g., circle-like shape); the second pads P1*b* overlapped with the second die 200 have the same shape (e.g., elliptical-like shape); and the third pads Plc overlapped with the third die 500 have the same shape (e.g., elliptical-like shape shorter than the second pads). The first pads P1, the second pads P1*b* and the third pads Plc have different shapes. In some embodiments, the first pads P1, the second pads P1*b* and the third pads Plc extend along different directions. In some embodiments, the first pads P1, the second pads P1*b* and the third pads Plc have different lengths.

In the staggered vias case, as shown in FIG. 12B, the staggered vias corresponding to the same die connector are not overlapped along direction Z. From the top view, a center of the third via V2*a* is offset from a center of the first via V1*a* by a first distance, a center of the fourth via V2*b* is offset from a center of the second via V1*b* by a second distance, and a center of the sixth via V2*c* is offset from a center of the fifth via V1*c* by a third distance. At least two of the first distance, the second distance and the third distance may be different under the die shift correction.

Figure 13:
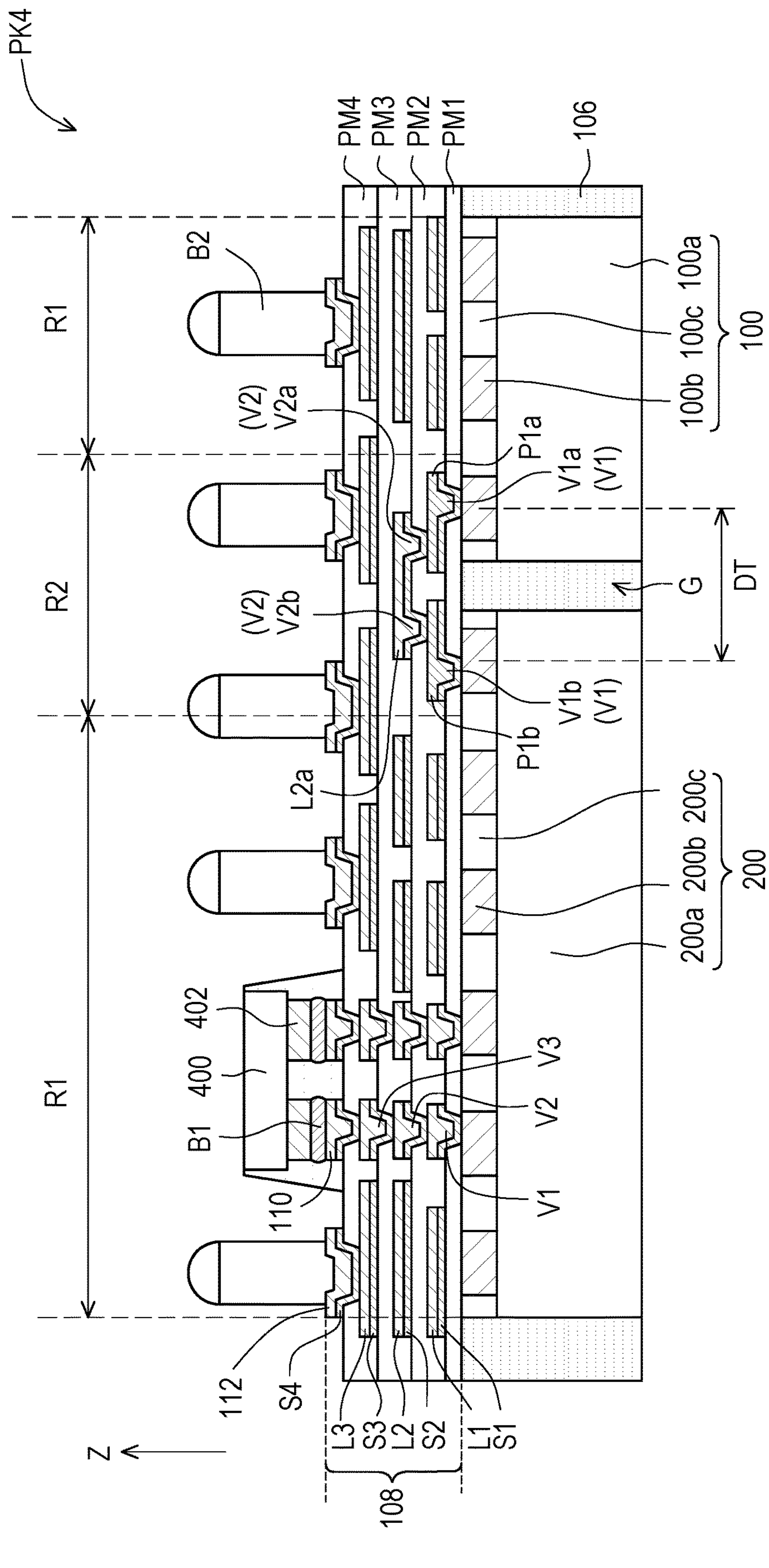
FIG. 13 is a schematic cross-sectional view illustrating a semiconductor package according to some embodiments of the present disclosure.

FIG. 13 is a schematic cross-sectional view illustrating a semiconductor package according to some embodiments of the present disclosure. Referring to FIG. 13, the main differences between the semiconductor package PK4 and the semiconductor package PK3 in FIG. 11 are illustrated below.

In the semiconductor package PK4, the first pad P1*a* is electrically connected with the second pad P1*b* through one of the plurality of lines and two of the plurality of vias of the redistribution layer structure 108, and the bridge die 300 in FIG. 11 is omitted. For example, the first pad P1*a* is electrically connected with the second pad P1*b* through a line L2*a* among the plurality of lines that extends across a gap G between the first die 100 and the second die 200 and two vias (e.g., the third via V2*a* and the fourth via V2*b*) among the plurality of vias that are respectively located between the line L2*a* and the first pad P1*a* and between the line L2*a* and the second pad P1*b*. In some embodiments, a distance DT between die connectors 100*b* and 200*b* of the first die 100 and the second die 200 can be less than or equal to 18 μm. In some embodiments, pitches of the die connectors 100*b* of the first die 100 can be less than or equal to 18 μm. In some embodiments, pitches of the die connectors 200*b* of the second die 200 can be less than or equal to 18 μm.

In addition, the redistribution layer structure 108 further includes vias V3, lines L3, a fourth polymer layer PM4 and a seed layer S4. Metal features (lines L3 and vias V3) are formed by lining via openings of the third polymer layer PM3 with a seed layer, forming a photoresist layer with line openings on the seed layer, plating the metal features (the lines L3 and the vias V3) from the seed layer, and removing the photoresist layer and the underlying the seed layer. Seed layers S3 are provided between the metal features (the lines L3 and the vias V3) and third polymer layer PM3. In some embodiments, the via openings of the third polymer layer PM3 are controlled properly (e.g., less than about 10 μm or 5 μm), so the formed vias V3 may have planar top surfaces for the landing of the overlying vias (if needed). The fourth polymer layer PM4 is then formed on the third polymer layer PM3. In some embodiments, the vias V3 are vertically aligned to (directly over) the underlying vias V2, but the disclosure is not limited thereto.

Connection pads 110 and under-ball metallurgy (UBM) pads 112 are formed through the fourth polymer layer PM4 and electrically connected to the underlying metal feature (the vias V3 and the lines L3) of the redistribution layer structure 108. In some embodiments, the connection pads 110 and the UBM pads 112 are regarded as part of the redistribution layer structure 108. In some embodiments, seed layers S4 are provided between the connection pads 110 and the fourth polymer layer PM4 and between the UBM pads 112 and the fourth polymer layer PM4. At least one die or device (e.g., device 400) with connection pads (e.g., connection pads 402) is bonded to the connection pads 110 through micro-bumps B1, and conductive elements or bumps B2 are placed on and electrically connected to the UBM pads 112.

Figure 14:
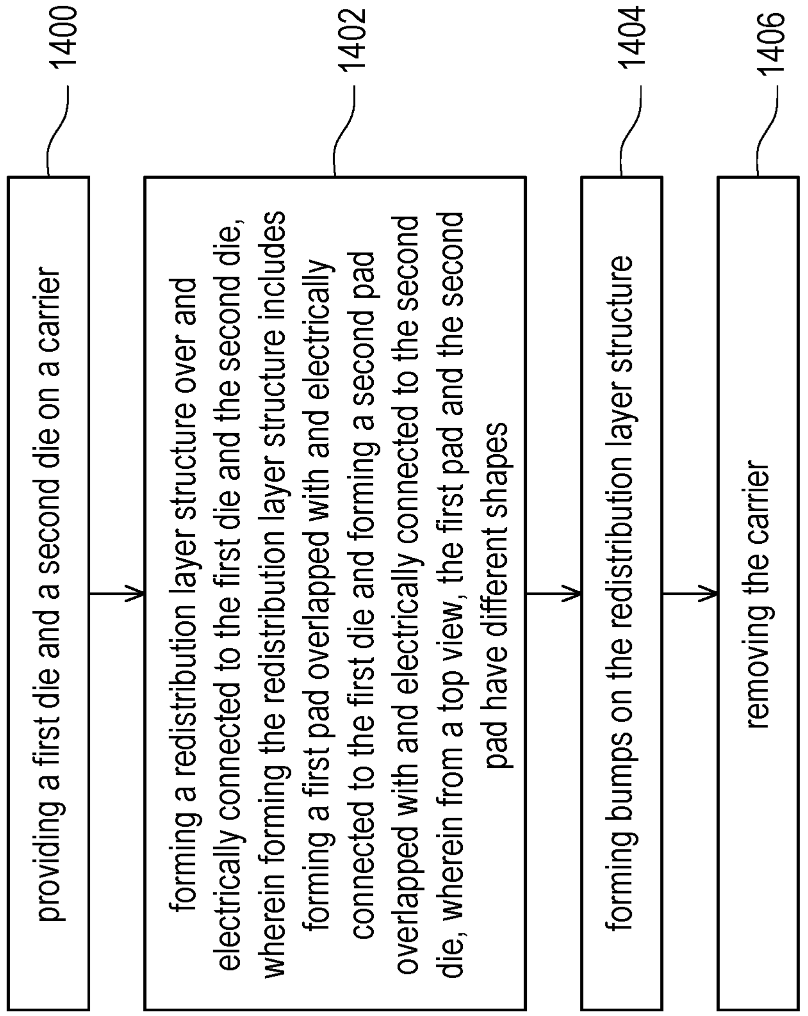
FIG. 14 is a flow chart showing a method of forming a semiconductor package according to some embodiments of the present disclosure.

FIG. 14 is a flow chart showing a method of forming a semiconductor package according to some embodiments of the present disclosure. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

Referring to FIG. 14, at act 1400, a first die and a second die are provided on a carrier. FIG. 1 illustrates a cross-sectional view corresponding to some embodiments of act 1400.

At act 1402, a redistribution layer structure is formed over and electrically connected to the first die and the second die, wherein forming the redistribution layer structure includes forming a first pad overlapped with and electrically connected to the first die and forming a second pad overlapped with and electrically connected to the second die, wherein from a top view, the first pad and the second pad have different shapes. FIG. 1B, FIG. 2B, FIG. 3B, FIG. 11, FIG. 12B and FIG. 13 illustrate different cross-sectional and top views corresponding to some embodiments of act 1402.

At act 1404, bumps are formed on the redistribution layer structure. FIG. 1C illustrates a cross-sectional view corresponding to some embodiments of act 1404.

At act 1406, the carrier is removed. FIG. 1D illustrates a cross-sectional view corresponding to some embodiments of act 1406.

Based on the above discussions, it can be seen that the present disclosure offers various advantages. It is understood, however, that not all advantages are necessarily discussed herein, and other embodiments may offer different advantages, and that no particular advantage is required for all embodiments.

According to some embodiments, a semiconductor package includes a first die, a second die and a redistribution layer structure. The first die and the second die are disposed laterally. The redistribution layer structure is disposed over and electrically connected to the first die and the second die, wherein the redistribution layer structure includes a plurality of vias and a plurality of lines stacked alternately and electrically connected to each other and embedded by a plurality of polymer layers. The redistribution layer structure further includes a first pad overlapped with and electrically connected to the first die and a second pad overlapped with and electrically connected to the second die. The first pad, the second pad and lines among the plurality of lines that are closest to the first die and the second die are located at substantially the same level, and from a top view, the first pad and the second pad have different shapes. In some embodiments, from the top view, the first pad and the second pad extend along different directions. In some embodiments, from the top view, the first pad and the second pad have different lengths. In some embodiments, the plurality of vias include a first via, a second via, a third via and a fourth via, the first via and the third via are stacked vias respectively located on opposite surfaces of the first pad, the second via and the fourth via are stacked vias respectively located on opposite surfaces of the second pad, from the top view, a center of the third via is offset from a center of the first via, and from the top view, a center of the fourth via is offset from a center of the second via. In some embodiments, the plurality of vias include a first via, a second via, a third via and a fourth via, the first via and the third via are staggered vias respectively located on opposite surfaces of the first pad, the second via and the fourth via are staggered vias respectively located on opposite surfaces of the second pad, from the top view, a distance between the first via and the third via is different from a distance between the second via and the fourth via. In some embodiments, the semiconductor package further includes a bridge die disposed over the first die and the second die and electrically connected the first die with the second die through the first pad and the second pad. In some embodiments, the first pad is electrically connected with the second pad through a line among the plurality of lines that extends across a gap between the first die and the second die and two vias among the plurality of vias that are respectively located between the line and the first pad and between the line and the second pad. In some embodiments, a distance between die connectors of the first die and the second die is less than or equal to 18 μm.

According to some embodiments, a semiconductor package includes a first die, a second die and a redistribution layer structure. The first die and the second die are disposed laterally. The redistribution layer structure is disposed over and electrically connected to the first die and the second die, wherein the redistribution layer structure includes a plurality of vias and a plurality of lines stacked alternately and electrically connected to each other and embedded by a plurality of polymer layers. The redistribution layer structure further includes at least one pad overlapped with and electrically connected to the first die or the second die, the at least one pad and lines among the plurality of lines that are closest to the first die and the second die are located at substantially the same level, and from a top view, the at least one pad has an elliptical-like shape. In some embodiments, the at least one pad includes a first pad overlapped with and electrically connected to the first die and a second pad overlapped with and electrically connected to the second die. In some embodiments, from the top view, the first pad and the second pad extend along different directions. In some embodiments, from the top view, the first pad and the second pad have different lengths. In some embodiments, the plurality of vias include a first via, a second via, a third via and a fourth via, the first via and the third via are stacked vias respectively located on opposite surfaces of the first pad, the second via and the fourth via are stacked vias respectively located on opposite surfaces of the second pad, from the top view, a center of the third via is offset from a center of the first via, and from the top view, a center of the fourth via is offset from a center of the second via. In some embodiments, the plurality of vias include a first via, a second via, a third via and a fourth via, the first via and the third via are staggered vias respectively located on opposite surfaces of the first pad, the second via and the fourth via are staggered vias respectively located on opposite surfaces of the second pad, and from the top view, a distance between the first via and the third via is different from a distance between the second via and the fourth via. In some embodiments, the semiconductor package further includes a bridge die disposed over the first die and the second die and electrically connected the first die with the second die through the first pad and the second pad. In some embodiments, the first pad is electrically connected with the second pad through a line among the plurality of lines that extends across a gap between the first die and the second die and two vias among the plurality of vias that are respectively located between the line and the first pad and between the line and the second pad.

According to some embodiments, a method of forming a semiconductor package includes: providing a first die and a second die on a carrier; forming a redistribution layer structure over and electrically connected to the first die and the second die, wherein forming the redistribution layer structure includes forming a first pad overlapped with and electrically connected to the first die and forming a second pad overlapped with and electrically connected to the second die, wherein from a top view, the first pad and the second pad have different shapes; forming bumps on the redistribution layer structure; and removing the carrier. In some embodiments, forming the redistribution layer structure further includes forming a plurality of vias and a plurality of lines alternately in a plurality of polymer layers, wherein regions of a first polymer layer among the plurality of polymer layers that is closest to the first die and the second die are respectively subject to a first exposure and a second exposure, wherein the first exposure and the second exposure are performed separately, and the first exposure and the second exposure are performed with a single photomask and a plurality of masking blades. In some embodiments, forming the first pad or the second pad includes forming a photoresist material layer and performing a plurality of exposures separately to the photoresist material layer with a single photomask and a plurality of masking blades. In some embodiments, at least one of a position and a rotation angle of the photomask is changed in the plurality of exposures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:

a first die and a second die disposed laterally; and a redistribution layer structure disposed over and electrically connected to the first die and the second die, wherein:

the redistribution layer structure comprises a plurality of vias and a plurality of lines stacked alternately and electrically connected to each other and embedded by a plurality of polymer layers, the redistribution layer structure further comprises a first pad overlapped with and electrically connected to the first die and a second pad overlapped with and electrically connected to the second die, the first pad, the second pad and lines among the plurality of lines that are closest to the first die and the second die are located at substantially the same level, and from a top view, the first pad is a first elongated pad extending along a first direction, and the second pad is a second elongated pad extending along a second direction different from the first direction, and the first elongated pad and the second elongated pad are different in length.

2. The semiconductor package as claimed in claim 1, wherein the first die comprises a first die connector overlapped with the first pad, the second die comprises a second die connector overlapped with the second pad, and from the top view, the first pad and the first die connector have different shapes, and the second pad and the second die connector have different shapes.

3. The semiconductor package as claimed in claim 2, wherein from the top view the first pad is surrounded by the first die connector, and the second pad is surrounded by the second die connector.

4. The semiconductor package as claimed in claim 1, wherein:

the plurality of vias comprise a first via, a second via, a third via and a fourth via, the first via and the third via are stacked vias respectively located on opposite surfaces of the first pad, the second via and the fourth via are stacked vias respectively located on opposite surfaces of the second pad, from the top view the third via is partially overlapped with the first via, and the fourth via is partially overlapped with the second via.

5. The semiconductor package as claimed in claim 4, wherein:

from the top view, a direction pointing from the first via to the third via is different from a direction pointing from the second via to the fourth via.

6. The semiconductor package as claimed in claim 1, further comprising:

a bridge die disposed over the first die and the second die and electrically connecting the first die with the second die through the first pad and the second pad.

7. The semiconductor package as claimed in claim 1, wherein the first pad is electrically connected with the second pad through a line among the plurality of lines that extends across a gap between the first die and the second die and two vias among the plurality of vias that are respectively located between the line and the first pad and between the line and the second pad.

8. The semiconductor package as claimed in claim 1, wherein the first die comprises a first die connector, the second die comprises a second die connector adjacent to the first die connector, and a distance between a center of the first die connector and a center of the second die connector is less than or equal to 18 μm.

9. A semiconductor package, comprising:

a first die and a second die disposed laterally; and a redistribution layer structure disposed over and electrically connected to the first die and the second die, wherein:

the redistribution layer structure comprises a plurality of vias and a plurality of lines stacked alternately and electrically connected to each other and embedded by a plurality of polymer layers, the redistribution layer structure further comprises a plurality of first pads electrically connected to the first die and a plurality of second pads electrically connected to the second die, the plurality of first pads, the plurality of second pads, and lines among the plurality of lines that are closest to the first die and the second die are located at substantially the same level, and from a top view the plurality of first pads are elongated pads extending along a first direction and having substantially a same first length along the first direction, the plurality of second pads are elongated pads extending along a second direction different from the first direction and having substantially a same second length along the second direction, and the second length is different from the first length.

10. The semiconductor package as claimed in claim 9, wherein from the top view, the first die comprises a first side extending along a third direction and a second side extending along a fourth direction substantially perpendicular to the third direction, the second die comprises a third side extending along the third direction and adjacent to the first side of the first die and a fourth side extending along the fourth direction and adjacent to the second side of the first die, and wherein the third side of the second die is offset from the first side of the first die by a first distance along the fourth direction, and the fourth side of the second die is offset from the second side of the first die by a second distance along the third direction, and the second distance is different from the first distance.

11. The semiconductor package as claimed in claim 9, wherein the first die comprises a plurality of first die connectors overlapped with the plurality of first pads, the second die comprises a plurality of second die connectors overlapped with the plurality of second pads, and from the top view one of the plurality of first pads is surrounded by a corresponding first die connector among the plurality of first die connectors, and one of the plurality of second pads is surrounded by a corresponding second die connector among the plurality of second die connectors.

12. The semiconductor package as claimed in claim 2, wherein the first die comprises a plurality of first die connectors overlapped with the plurality of first pads, the second die comprises a plurality of second die connectors overlapped with the plurality of second pads, and from the top view, one of the plurality of first pads protrudes out of a corresponding first die connector among the plurality of first die connectors, and one of the plurality of second pads protrudes out of a corresponding second die connector among the plurality of second die connectors.

13. The semiconductor package as claimed in claim 9, wherein:

the plurality of vias comprise a plurality of first vias, a plurality of second vias, a plurality of third vias and a plurality of fourth vias, the plurality of first vias and the plurality of third vias are stacked vias respectively located on opposite surfaces of the plurality of first pads, the plurality of second vias and the plurality of fourth vias are stacked vias respectively located on opposite surfaces of the plurality of second pads, from the top view centers of the plurality of third vias are offset from centers of the plurality of first vias, and from the top view centers of the plurality of fourth vias are offset from centers of the plurality of second vias.

14. The semiconductor package as claimed in claim 13, wherein:

from the top view, a distance between one of the plurality of first vias and a corresponding third via is different from one of the plurality of second vias and a corresponding fourth via.

15. The semiconductor package as claimed in claim 9, further comprising:

a bridge die disposed over the first die and the second die and electrically connecting the first die with the second die through one of the plurality of first pads and one of the plurality of second pads.

16. The semiconductor package as claimed in claim 9, wherein one of the plurality of first pads is electrically connected with one of the plurality of second pads through a line among the plurality of lines that extends across a gap between the first die and the second die and two vias among the plurality of vias that are respectively located between the line and the one of the plurality of first pads and between the line and the one of the plurality of second pads.

17. A method of forming a semiconductor package, comprising:

providing a first die and a second die on a carrier;

forming a redistribution layer structure over and electrically connected to the first die and the second die, wherein forming the redistribution layer structure comprises forming a first pad overlapped with and electrically connected to the first die and forming a second pad overlapped with and electrically connected to the second die, wherein from a top view, the first pad is a first elongated pad extending along a first direction, and the second pad is a second elongated pad extending along a second direction different from the first direction, and the first elongated pad and the second elongated pad are different in length;

forming bumps on the redistribution layer structure; and removing the carrier.

18. The method of forming the semiconductor package as claimed in claim 17, wherein forming the redistribution layer structure further comprises forming a plurality of vias and a plurality of lines alternately in a plurality of polymer layers, wherein regions of a first polymer layer among the plurality of polymer layers that is closest to the first die and the second die are respectively subject to a first exposure and a second exposure, wherein the first exposure and the second exposure are performed separately, and the first exposure and the second exposure are performed with a single photomask and a plurality of masking blades.

19. The method of forming the semiconductor package as claimed in claim 17, wherein forming the first pad or the second pad comprises forming a photoresist material layer and performing a plurality of exposures separately to the photoresist material layer with a single photomask and a plurality of masking blades.

20. The method of forming the semiconductor package as claimed in claim 19, wherein at least one of a position and a rotation angle of the photomask is changed in the plurality of exposures.

* * * * *